(12) United States Patent
Toncich et al.

(10) Patent No.: US 6,741,211 B2
(45) Date of Patent: May 25, 2004

(54) TUNABLE DIPOLE ANTENNA

(75) Inventors: Stanley S. Toncich, San Diego, CA (US); Allen Tran, San Diego, CA (US)

(73) Assignee: Kyocera Wireless Corp., San Diego, CA (US)

(*) Notice: Subject to any disclaimer, the term of this patent is extended or adjusted under 35 U.S.C. 154(b) by 0 days.

(21) Appl. No.: 10/121,773

(22) Filed: Apr. 11, 2002

(65) Prior Publication Data

US 2002/0167454 A1 Nov. 14, 2002

Related U.S. Application Data

(60) Provisional application No. 60/283,093, filed on Apr. 11, 2001.

(51) Int. Cl.[7] .............................................. H01Q 1/38
(52) U.S. Cl. ................................. 343/700 MS; 343/895
(58) Field of Search ........................ 343/700 MS, 787, 343/793, 795, 895

(56) References Cited

U.S. PATENT DOCUMENTS

| 3,413,543 A | 11/1968 | Schubring |
|---|---|---|
| 3,676,803 A | 7/1972 | Simmons |

(List continued on next page.)

FOREIGN PATENT DOCUMENTS

| EP | 0 637 131 A1 | 2/1995 |
|---|---|---|
| EP | 0 638 953 A1 | 2/1995 |
| EP | 0 680 108 A1 | 4/1995 |
| EP | 0 843 374 A2 | 5/1998 |
| EP | 0 881 700 A1 | 5/1998 |
| JP | 2001338839 | 12/2001 |
| WO | WO 00/28613 | 5/2000 |
| WO | WO 00/35042 | 6/2000 |
| WO | WO 00/62367 | 10/2000 |

OTHER PUBLICATIONS

A. Presser, "Varactor–Tunable, High–Q Microwave Filter," RCA Review, vol. 42, Dec. 1981, pp. 691–705.

C. Chang and T. Itoh, "Microwave Active Filters Based on Coupled Negative Resistance Method," IEEE Transactions on Microwave Theory and Techniques, vol. 38, No. 12. Dec. 1990, pp. 1879–1884.

P. Katzin, B. Bedard, Y. Ayasli, "Narrow–Band MMIC Filters with Automatic Tuning and Q–Factor Control," 1993 IEEE MTT–S Digest pp. 403–406.

(List continued on next page.)

*Primary Examiner*—James Clinger

(57) ABSTRACT

A family of FE dielectric-tuned antennas and a method for frequency tuning a wireless communications antenna are provided. The method comprises: forming a radiator; forming a dielectric with ferroelectric material proximate to the radiator; applying a voltage to the ferroelectric material; in response to applying the voltage, generating a dielectric constant; and, in response to the dielectric constant, communicating electromagnetic fields at a resonant frequency. Some aspects of the method further comprise: varying the applied voltage; and, modifying the resonant frequency in response to changes in the applied voltage. Modifying the resonant frequency includes forming an antenna with a variable operating frequency responsive to the applied voltage. Alternately stated, forming an antenna with a variable operating frequency includes forming an antenna with a predetermined fixed characteristic impedance, independent of the resonant frequency.

1 Claim, 17 Drawing Sheets

U.S. PATENT DOCUMENTS

| | | | |
|---|---|---|---|
| 3,678,305 | A | 7/1972 | Paige |
| 3,836,874 | A | 9/1974 | Maeda |
| 3,918,012 | A | 11/1975 | Peuzin |
| 4,475,108 | A | 10/1984 | Moser |
| 4,733,328 | A | 3/1988 | Blazej |
| 4,799,066 | A | 1/1989 | Deacon |
| 4,835,499 | A | 5/1989 | Pickett |
| 5,166,857 | A | 11/1992 | Avanic et al. |
| 5,212,463 | A | 5/1993 | Babbitt et al. |
| 5,216,392 | A | 6/1993 | Fraser et al. |
| 5,307,033 | A | 4/1994 | Koscica et al. |
| 5,427,988 | A | 6/1995 | Sengupta et al. |
| 5,450,092 | A | 9/1995 | Das |
| 5,472,935 | A | 12/1995 | Yandrofski et al. |
| 5,496,795 | A | 3/1996 | Das |
| 5,557,286 | A | 9/1996 | Varadan et al. |
| 5,561,407 | A | 10/1996 | Koscica et al. |
| 5,589,845 | A | 12/1996 | Yandrofski et al. |
| 5,617,104 | A | 4/1997 | Das |
| 5,640,042 | A | 6/1997 | Koscica et al. |
| 5,729,239 | A | 3/1998 | Rao |
| 5,777,524 | A | 7/1998 | Wojewoda et al. |
| 5,778,308 | A | 7/1998 | Sroka et al. |
| 5,880,921 | A | 3/1999 | Tham et al. |
| 5,945,887 | A | 8/1999 | Makino et al. |
| 5,973,567 | A | 10/1999 | Heal et al. |
| 5,973,568 | A | 10/1999 | Shapiro et al. |
| 5,987,314 | A | 11/1999 | Saito |
| 6,028,561 | A | 2/2000 | Takei |
| 6,049,726 | A | 4/2000 | Gruenwald et al. |
| 6,052,036 | A | 4/2000 | Enstrom et al. |
| 6,097,263 | A | 8/2000 | Mueller et al. |
| 6,160,524 | A | 12/2000 | Wilber |
| 6,198,441 | B1 | 3/2001 | Okabe et al. |
| 6,292,143 | B1 * | 9/2001 | Romanofsky ........ 343/700 MS |
| 6,333,719 | B1 | 12/2001 | Varadan |
| 6,335,710 | B1 * | 1/2002 | Falk et al. .................. 343/895 |

OTHER PUBLICATIONS

B. Hopf, I. Wolff, M.Guglieimi, "Coplanar MMIC Active Bandpass Filters Using Negative Resistance Circuits," 1994 IEEE MTT–S Digest pp. 1183–1185.

U. Karacaoglu and I. D. Robertson, "High Selectivity Varactor–Tuned MMIC Bandpass Filter Using Lossless Active Resonators," 1994 IEEE MTT–S Digest pp. 1191–1194.

B. Nauta, "A CMOS Transconductance–C Filter Technique for Very High Frequencies," IEEE Journal of Solid–State Circuits, vol. 27, No. 2, Feb. 1992, pp. 142–153.

K. Fujita, H. Itoh, R. Yamamoto, "A 15.6 GHz Commercially Based 1/8 GaAs Dynamic Prescaler," 1989 IEEE GaAs IC Symposium, pp. 113–116.

J. Smuk, P. Katzin, "MMIC Phase Locked L–S Band Oscillators," 1994 GaAs IC Symposium Digest, pp. 27–29.

S. R. Chandler, I.C. Hunter, J. G. Gardiner, "Active Varactor Tunable Bandpass Filter," IEEE Microwave and Guided Wave Letters, vol. 3, No. 3, Mar. 1993.

I. C. Hunter, J. D. Rhodes, "Electronically Tunable Microwave Bandpass Filters," IEEE Transactions on Microwave Theory and Techniques, vol. MTT–30, No. 9, Sep. 1982, pp. 1354–1367.

S. Toyoda, "Quarter–Wavelength Coupled Variable Bandstop and Bandpass Filter Using Varactor Diodes," IEEE Transactions on Microwave Theory and Techniques, vol. MTT–30, No. 9, Sep. 1982, pp. 1387–1389.

B. Yu.Kapilevich, "Variety of Approaches to Designing Microwave Active Filters," Proc. 27th European Microwave Conf., Jerusalem, vol. 1, 1997, pp. 397–408.

B. Kapilevich, "Understand the Operation of Channelized Active Filters," Microwaves & RF, Jan. 1997, pp. 89–92.

M. Dishall, "Alignment and Adjustment of Synchronously Tuned Multiple–Resonant–Circuit Filters," Proceedings of the IRE 39, Nov. 1951, pp. 1448–1455.

S. Cohn, "Dissipation Loss in Multiple–Coupled Resonator Filters," Proceedings of the IRE 47, Aug. 1959, pp. 1342–1348.

G. L. Matthaei, "An Electronically Tunable Up–Convertor," Proceedings of the IRE 49, Nov. 1961, pp. 1703–1704.

E. G. Fubini, E. A. Guillemin, "Minimum Insertion Loss Filters," Proceedings of the IRE 47, Jan. 1959, pp. 37–41.

W. J. Getsinger, "Prototypes for Use in Broadbanding Reflection Amplifiers," IEEE Transactions on Microwave Theory and Techniques, PTGMTT–11, Nov. 1963, pp. 486–497.

E. S. Kuh, M. Fukeda, "Optimum Synthesis of Wide–Band Parametric Amplifiers and Converters," IRE Transactions on Circuit Theory, PCCT–8, Dec. 1961, pp. 410–415.

W. J. Getsinger, G. L. Malthaei, "Some Aspects of the Design of Wide–Band Up–Converters and Nondegenerate Parametric Amplifiers," IEEE Transactions of Microwave Theory and Techniques, PTGMTT–12, Jan. 1964, pp. 77–87.

R. L. Sleven, "Design of a Tunable Multi–Cavity Waveguide Band–Pass Filter," 1959 IRE National Convention Record, Part 3, pp. 91–112.

J. J. Taub, B. F. Bodner, "Design of Three–Resonator Dissipative Band–Pass Filters Having Minimum Insertion Loss," Proceedings of the IRE 45, May 1957, pp. 681–687.

K. L. Kotzebue, "Broadband Electronically–Tuned Microwave Filters," 1960 IRE Wescon Convention Record, Part 1, pp. 21–27.

J. P. Louhos, I. Pankinaho, "Electrical Tuning of Integrated Mobile Phone Antennas," Nokia Mobile Phones, Sep. 15, 1999, pp. 69–97.

P. K. Panayi, M. Al–Nuaimi, L. P. Ivrissimtzis, "Tuning Techniques for the Planar Inverted–F Antenna," National Conference on Antennas and Propagation Publication, No. 461, Apr. 1999, pp. 259–262.

Satoshi Makioka et al, "A High Efficiency GaAs MCM Power Amplifier for 1.9GHz Digital Cordless Telephones," IEE 1994 Microwave and Millimeter–Wave Monolithic Circuits Symposium, 1994, pp. 51–54.

V. K. Varadan, K. A. Jose, V. V. Varadan, "Design and Development of Electronically Tunable Microstrip Antennas," IOP Publishing Ltd., 1999, pp. 238–242.

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB01087 (Jul. 19, 2002).
International Search Report: PCT/IB 02/01107 (Jul. 11, 2002).
International Search Report: PCT/IB 02/01120 (Jul. 11, 2002).
International Search Report: PCT/IB 02/01098 (Jul. 4, 2002).
International Search Report: PCT/IB 02/01082 (Jul. 8, 2002).
International Search Report: PCT/IB 02/01144 (Jul. 12, 2002).
International Search Report: PCT/IB 02/01026 (Jun. 28, 2002).
International Search Report: PCT/IB 02/01027 (Jun. 25, 2002).

* cited by examiner

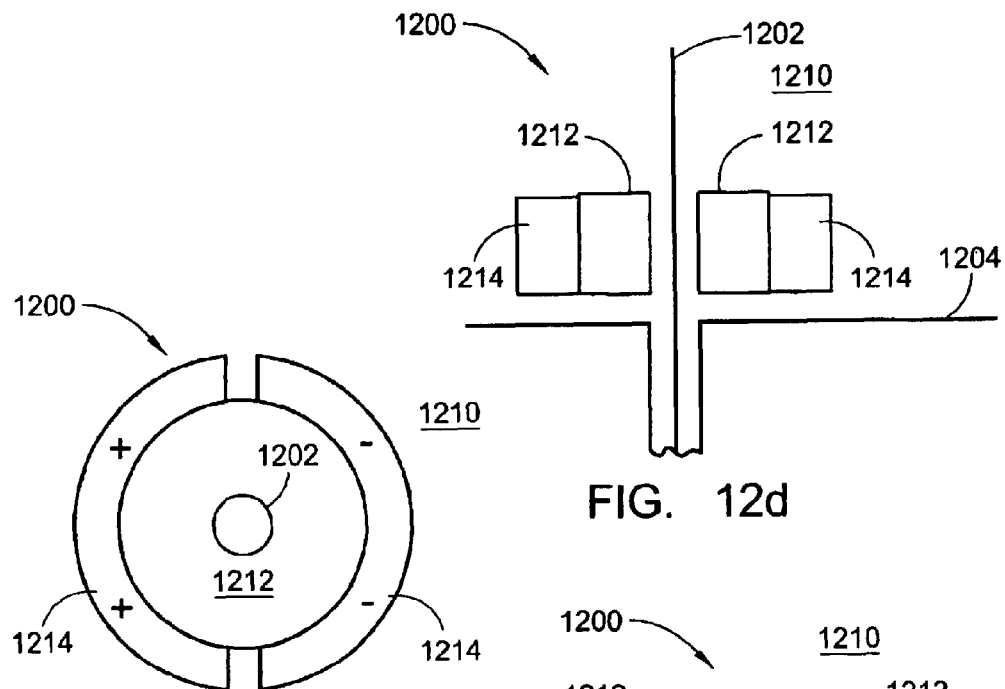
FIG. 12d
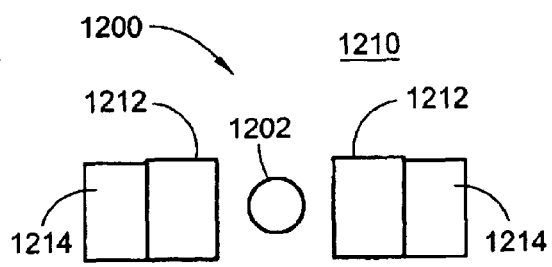
FIG. 12e
FIG. 12f
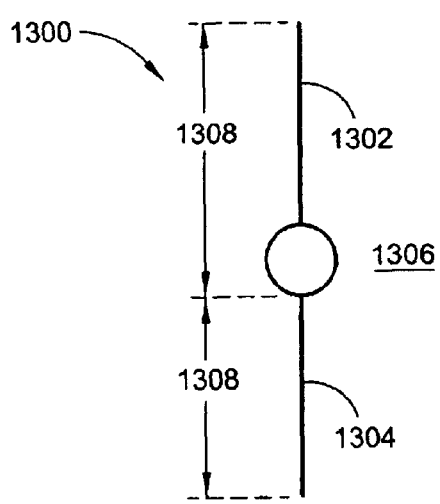
FIG. 13a
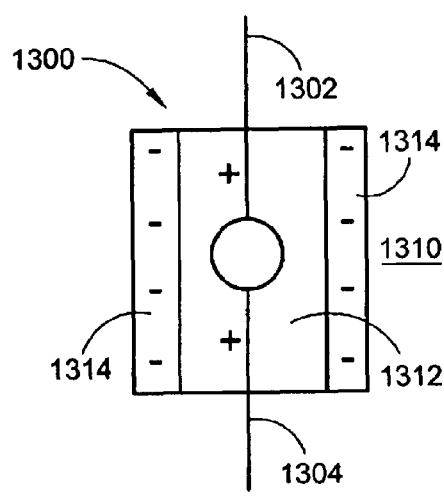
FIG. 13b

TUNABLE DIPOLE ANTENNA

RELATED APPLICATIONS

This application claims the benefit of U.S. Provisional Application 60/283,093, filed Apr. 11, 2001, which is hereby incorporated by reference. In addition, this application relates to the following U.S. applications, which are hereby incorporated by reference: U.S. Pat. No. 09/904,631 filed on Jul. 13, 2001, by Stanley S. Toncich entitled "Ferro-Electric Tunable Filter"; 09/912,753 filed on Jul. 24, 2001 by Stanley S. Toncich entitled "Tunable Ferro-Electric Multiplexer"; 09/927,732 filed on Aug. 8, 2001, by Stanley S. Toncich entitled "Low Loss Tunable Ferro-Electric Device and Method of Characterization"; 09/927,136 filed on Aug. 10, 2001, by Stanley S. Toncich entitled "Tunable Matching Circuit"; 10/044,522 filed on Jan. 11, 2002, by Stanley S. Toncich entitled "Tunable Planar Capacitor"; 10/077,654 filed on Feb. 14, 2002, by Stanley S. Toncich entitled "Tunable Isolator Matching Circuit"; 10/076,171 filed on Feb. 12, 2002, by Stanley S. Toncich entitled "Antenna Interface Unit"; 10/075,896 filed Feb. 12, 2002, by Stanley S. Toncich entitled "Tunable Antenna Matching Circuit"; 10/075,727 filed Feb. 12, 2002, by Stanley S. Toncich and Tim Forrester entitled "Tunable Low Noise Amplifier"; 10/075,507 filed on Feb. 12, 2002, by Stanley S. Toncich entitled "Tunable Power Amplifier Matching Circuit".

BACKGROUND OF THE INVENTION

1. Field of the Invention

This invention generally relates to wireless communication antennas and, more particularly, to a system and method for tuning an antenna with the aid of a ferroelectric dielectric material.

2. Description of the Related Art

There are several types of conventional antenna designs that incorporate the use of a dielectric material. Generally speaking, a portion of the field that is generated by the antenna returns to the counterpoise (ground), from the radiator, through the dielectric. The antenna is tuned to be resonant at frequencies, and the wavelengths of the radiator and dielectrics have an optimal relationship at the resonant frequency. The most common dielectric is air, with a dielectric constant of 1. The dielectric constants of other materials are defined with respect to air.

Ferroelectric materials have a dielectric constant that changes in response to an applied voltage. Because of their variable dielectric constant, ferroelectric materials are good candidates for making tunable components. Under presently used measurement and characterization techniques, however, tunable ferroelectric components have gained the reputation of being consistently and substantially lossy, regardless of the processing, doping or other fabrication techniques used to improve their loss properties. They have therefore not been widely used. Ferroelectric tunable components operating in RF or microwave regions are perceived as being particularly lossy. This observation is supported by experience in Radar applications where, for example, high radio frequency (RF) or microwave loss is the conventional rule for bulk (thickness greater than about 1.0 mm) FE (ferroelectric) materials especially when maximum tuning is desired. In general, most FE materials are lossy unless steps are taken to improve (reduce) their loss. Such steps include, but are not limited to: (1) pre and post deposition annealing or both to compensate for O2 vacancies, (2) use of buffer layers to reduce surfaces stresses, (3) alloying or buffering with other materials and (4) selective doping.

As demand for limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss. In wireless communications, for example, a Q of greater than 80, and preferably greater than 180 and, more preferably, greater than 350, is necessary at frequencies of about 2 GHz. These same assumptions apply to the design of antennas.

Tunable ferroelectric components, especially those using thin films, can be employed in a wide variety of frequency agile circuits. Tunable components are desirable because they can provide smaller component size and height, lower insertion loss or better rejection for the same insertion loss, lower cost and the ability to tune over more than one frequency band. The ability of a tunable component that can cover multiple bands potentially reduces the number of necessary components, such as switches that would be necessary to select between discrete bands were multiple fixed frequency components used. These advantages are particularly important in wireless handset design, where the need for increased functionality and lower cost and size are seemingly contradictory requirements. With code division multiple access (CDMA) handsets, for example, performance of individual components is highly stressed.

It is known to use ferroelectric materials for the purpose of frequency tuning antennas. However, the use of FE dielectric materials has not always been effective, especially if the FE materials are not located in the regions of greatest electromagnetic filed densities. In the case of a conventional patch antenna, the region of greatest electromagnetic fields is between the radiator and the counterpoise (ground). As a result of ineffective FE dielectric placement, the changes in dielectric constant have a minimal effect on changes in the resonant frequency of the antenna. To achieve a useful change in resonant frequency, these conventional FE dielectric antennas have had to rely on multiple radiators.

It would be advantageous if the resonant frequency of an antenna could be selectable during use.

It would be advantageous if FE material could be used to control the resonant frequencies of an antenna.

It would be advantageous if the resonant frequency of an FE material antenna could be changed in response to applying a voltage to the FE material.

It would be advantageous if FE material antenna could be used to effectively change the resonant frequency of a conventional design antenna with a single radiator.

SUMMARY OF THE INVENTION

The present invention describes antennas fabricated with FE materials as a dielectric. The dielectric constant of the FE material can be controlled by an applied voltage. Because there is a fixed relationship between dielectric constant and resonant frequency, the resonant frequency of the antenna can be controlled using the applied voltage.

Accordingly, a method is provided for frequency tuning a single-band wireless communications antenna. The method comprises: forming a radiator; forming a dielectric with ferroelectric material proximate to the radiator; applying a voltage to the ferroelectric material; in response to applying the voltage, generating a dielectric constant; and, in response to the dielectric constant, communicating electromagnetic fields at a resonant frequency. Some aspects of the method further comprise: varying the applied voltage; and, modifying the resonant frequency in response to changes in the applied voltage.

Modifying the resonant frequency includes forming an antenna with a variable operating frequency responsive to the applied voltage. Alternately stated, forming an antenna with a variable operating frequency includes forming an antenna with a predetermined fixed characteristic impedance, independent of the resonant frequency.

In some aspects of the method forming a radiator includes forming a single-radiator.

In some aspects of the method forming a dielectric with ferroelectric material includes: forming the dielectric with a dielectric material from a first material having a fixed dielectric constant; and, forming the dielectric with the ferroelectric material having a variable dielectric constant. Then, modifying the resonant frequency includes modifying the resonant frequency in response to the varying the dielectric constant of the ferroelectric material.

In other aspects, forming a dielectric with ferroelectric material includes forming the dielectric with a plurality of dielectric materials, each from a material having a fixed dielectric constant. Alternately or in addition, forming a dielectric with ferroelectric material includes forming the dielectric with a plurality of ferroelectric materials, each having a variable dielectric constant.

Additional details of the above-described method and a family of antennas fabricated with a FE material dielectric are described below

DESCRIPTION OF THE DRAWINGS

FIG. 2 is a cross-sectional drawing illustrating an alternate aspect of the patch antenna of FIG. 1a.

FIGS. 12a through 12f are depictions of the present invention monopole antenna with a selectable operating frequency.

FIGS. 13a through 13f are drawings of the present invention dipole antenna with a selectable operating frequency.

DETAILED DESCRIPTION OF THE PREFERRED EMBODIMENTS

The present invention describes a family of antennas with a selectable operating frequency. Generally, each antenna includes a radiator and a dielectric with ferroelectric material proximate to the radiator having a variable dielectric constant. The radiator is resonant at a frequency responsive to the dielectric constant of the ferroelectric material. Some antennas include a counterpoise to the radiator. Other antenna designs include a counterpoise and radiator that are arbitrarily designated. Yet other designs include a counterpoise and radiator that are not distinctly distinguishable from each other.

In one aspect of the present invention, the family of antennas presented below have an FE dielectric layer included to effectively tune the resonant frequency of a single-radiator antenna, unlike prior art antennas which rely upon multiple radiators to achieve any appreciable bandwidth or resonant frequency change. The present invention single-radiator antennas are defined herein as single-band, in that they each have one fundament frequency (excluding the consideration of harmonics of the fundamental) of resonance corresponding to the single radiator. In another aspect of the present invention family of antennas the FE dielectric is located in the regions of densest electromagnetic fields between the radiator and counterpoise (or virtual counterpoise). As a result, changes in the dielectric constant of the FE material produce significant changes in the resonant frequency of the antenna.

Figure 1A:
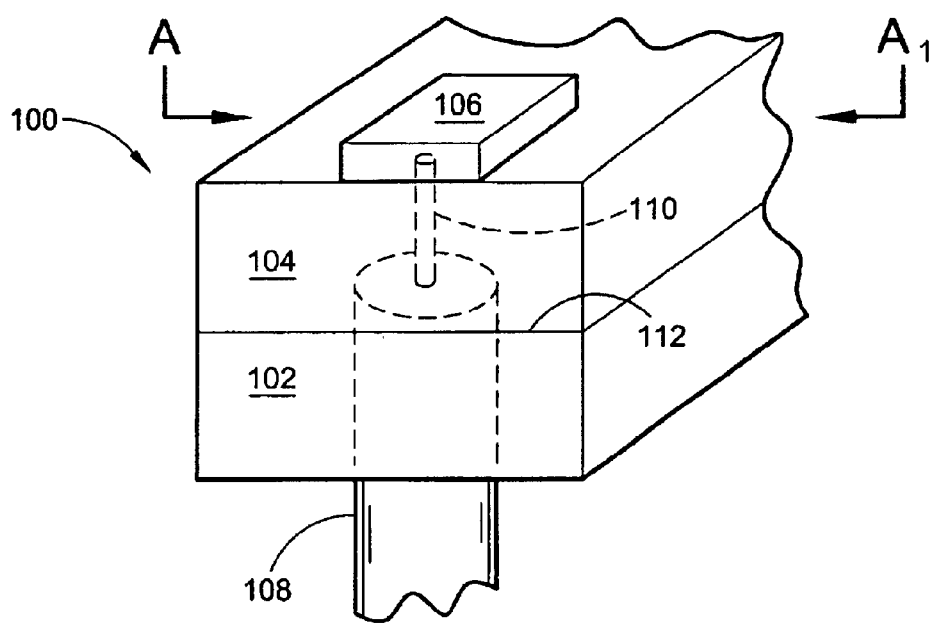
FIGS. 1a through 1c are views of the present invention patch antenna with a selectable operating frequency.
Figure 1B:
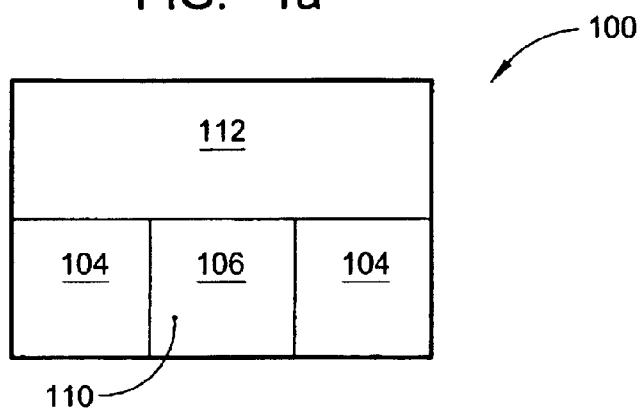
Figure 1C:
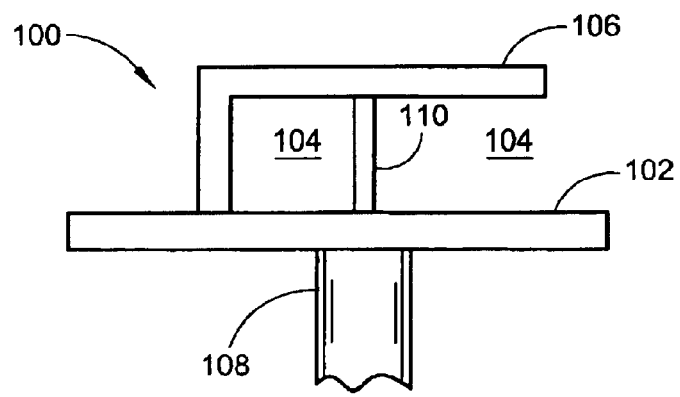

FIGS. 1a through 1c are views of the present invention patch antenna with a selectable operating frequency. FIG. 1a is a perspective view of a single-band patch antenna that may have half-wavelength radiator dimensions. The patch antenna 100 comprises a counterpoise 102 and a dielectric with ferroelectric material 104 overlying the counterpoise. The dielectric has a varying dielectric constant responsive to a voltage applied to the ferroelectric material. At least one radiator 106 overlies the dielectric 104 having a resonant frequency responsive to the dielectric constant. In some aspects of the patch antenna 100, the dielectric 104 is a layer consisting entirely of FE material. The principles and design of patch antennas are well understood by those skilled in the art and are not repeated here in the interest of brevity. Although the use of FE material gives a patch antenna a wider range of selectable operating frequencies, the general principles of design are not changed by the present invention FE material. A coaxial feedline 108 has a center conductor 110 connected to the radiator 106 and a ground connected to the counterpoise 102.

FIG. 1b is a plan view of the patch antenna 100 of FIG. 1a. Typically, the dielectric with FE material is only placed in the vicinity of the radiator 106. Area 112 may be a dielectric with a fixed constant. In alternate embodiments not shown, the FE dielectric 104 may surround the radiator 106 evenly on all sides, or the dielectric areas 104 and 112 may be formed symmetrically around the radiator 106.

FIG. 1c is a cross-sectional view of an inverted-F planar antenna, such as might be suitable with quarter-wavelength radiator dimensions. The FE dielectric 104 is shown interposed between the single-radiator 106 and the counterpoise 102, however, other FE dielectric patterns and distributions are also practical.

The antenna 100 has a predetermined fixed characteristic impedance independent of the resonant frequency. That is, the input impedance remains 50 ohms for example, despite the operating frequency selected. Alternately, it can be said that the antenna 100 has a predetermined approximately constant gain independent of the resonant frequency.

Figure 2:
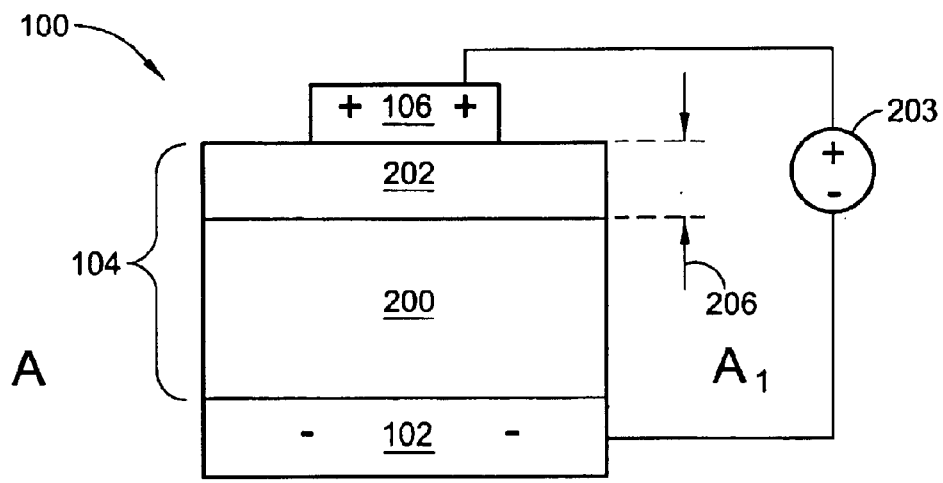

FIG. 2 is a cross-sectional drawing illustrating an alternate aspect of the patch antenna of FIG. 1a. As shown, the dielectric 104 includes at least one dielectric layer 200 formed from a first material with a fixed dielectric constant and a dielectric 202 formed from a ferroelectric material with a variable dielectric constant, adjacent the dielectric 200 with the fixed dielectric constant. As shown, the dielectric with the FE material 202 overlies the dielectric with the fixed dielectric constant 200. Typically a voltage is applied to a conductor in the vicinity of the FE dielectric layer 202 to create a desired dielectric constant. The voltage, represented by the "+" and "−" signs can be supplied by voltage generator 203. In some aspects, an electrical insulator (not shown) can be interposed between layer 202 and the conductive radiator 106 to isolate the bias voltage from the ac signal voltage. However, a sheet of conductor is usually required to evenly distribute the bias voltage over the FE dielectric 202 that interferes with the antenna tuning. Therefore, the dc voltage is typically superimposed upon ac signal being conducted by the radiator, and the reference ground is supplied to the counterpoise 102. Alternately but not shown, the dielectric formed with the fixed dielectric constant 200 overlies the dielectric with the ferroelectric material 202. Again, an insulator might be interposed between the FE dielectric layer 202 and the conductive counterpoise, and a reference ground supplied that is different from the voltage at the counterpoise. However as shown, the FE dielectric layer is typically biased with a reference ground supplied to the counterpoise. Note, in some aspects of the antenna the bias voltage polarities are reversed from the polarity shown.

Figure 3:
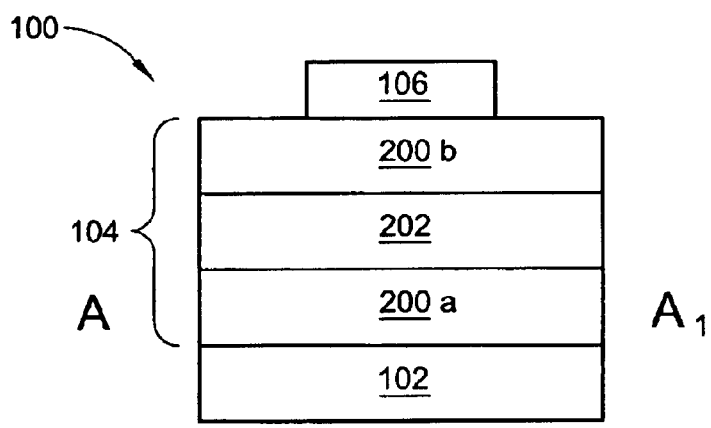
FIG. 3 is a cross-sectional drawing illustrating an alternate aspect of the patch antenna of FIG. 1a with multiple fixed dielectric constant layers.

FIG. 3 is a cross-sectional drawing illustrating an alternate aspect of the patch antenna of FIG. 1*a* with multiple fixed dielectric constant layers. The dielectric with the fixed dielectric forms a first layer 200*a* underlying the dielectric with the fixed dielectric constant 202, and a second layer 200*b* overlies the dielectric with the ferroelectric material 202. The two fixed dielectric layers need not necessarily have the same dielectric constant. Further, the use of three or more layers of fixed dielectric is also possible. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 4:
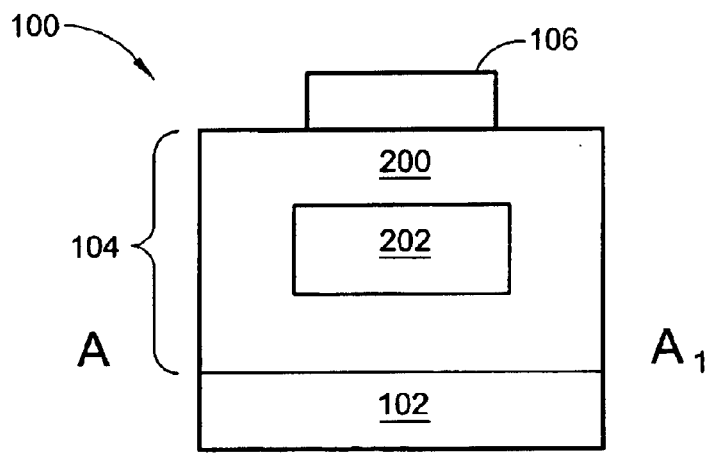
FIG. 4 is a cross-sectional drawing illustrating an alternate aspect of the patch antenna of FIG. 1a with an internal layer of FE material.

FIG. 4 is a cross-sectional drawing illustrating an alternate aspect of the patch antenna of FIG. 1*a* with an internal layer of FE material. As shown, the dielectric with the ferroelectric material 202 is formed internal to the dielectric 200 with the fixed dielectric constant. Alternately but not shown, the dielectric with the fixed dielectric constant 200 is formed internal to the FE dielectric 202. Further, multiple internal FE dielectric regions could be used.

In some aspects, the dielectric with ferroelectric material 202 is formed from barium strontium titanate, $Ba_xSr_{1-x}TiO_3$ (BSTO). However, alternate FE materials are well known and may perform equivalently. Returning the FIG. 2 for example, the dielectric with ferroelectric material 202 can be formed in a thin film layer having a thickness 206 in the range from 0.15 to 2 microns. Alternately, the dielectric with ferroelectric material 202 is formed in a thick film having a thickness 206 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant 200 and the dielectric formed from the ferroelectric material 202 have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

FIGS. 5*a* through 9*e* illustrate a family of present invention slot antennas. Generally, each single-band slot antenna includes a counterpoise and a dielectric with ferroelectric material overlying the counterpoise. However, some slots antennas can be understood as just having a radiator, or having a virtual radiator and virtual counterpoise. A slot, formed in either the counterpoise or the radiator has an electrical length responsive to the dielectric constant and the dielectric has a varying dielectric constant responsive to a voltage applied to the ferroelectric material. A radiator overlies and is proximate to the dielectric.

It is also generally true that the radiator in each of the slot designs has a predetermined fixed characteristic impedance independent of the resonant frequency. That is, the electrical length of the slot(s) is constant with respect to the resonant frequency. Alternately, the radiator has a predetermined approximately constant gain independent of the resonant frequency. It is also generally true that the slot (or slots) have an electrical length that varies in response to the dielectric constant(s) to be either approximately one-half wavelength of the resonant frequency with respect to the dielectric, or approximately one-quarter wavelength of the resonant frequency with respect to the dielectric. The principles and design of slot antennas are well understood by those skilled in the art and are not repeated here in the interest of brevity. Although the use of FE material gives a slot antenna a wider range of selectable operating frequencies, the general principles of design are not changed by the present invention FE material.

Figure 5A:
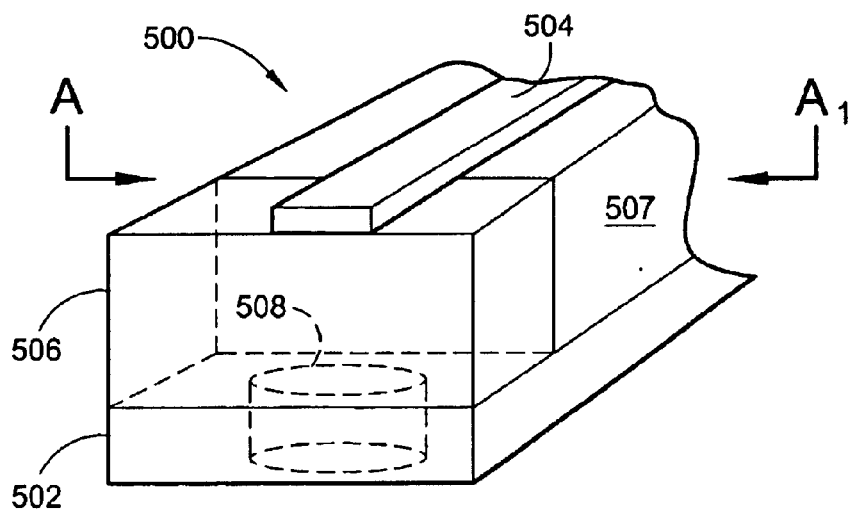
FIGS. 5a through 9e illustrate a family of present invention slot antennas.

FIG. 5*a* is a perspective view of the present invention microstrip slot antenna 500. A counterpoise 502, a radiator 504, and a dielectric with ferroelectric material 506 form the microstrip. Typically, the dielectric with ferroelectric material 506 is located in the vicinity of the slot, as shown. Away from the slot a different dielectric 507 may be used with a fixed dielectric constant. A slot 508 is formed in the counterpoise 502. As shown, the slot 508 is transverse to the radiator 504, but it need not be. In other aspects of the microstrip slot 500, a plurality of slots (not shown) are used.

Figure 5B:
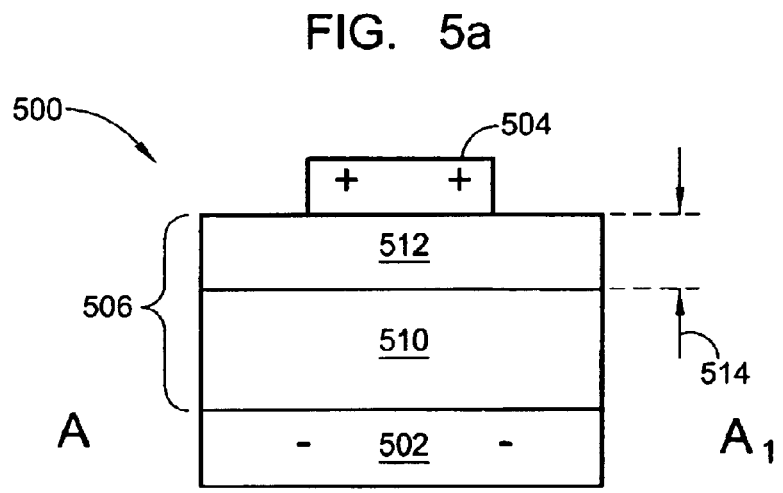

FIG. 5*b* is a cross-sectional drawing illustrating an alternate aspect of the microstrip slot antenna of FIG. 5*a*. As shown, the dielectric 506 includes at least one dielectric layer 510 formed from a first material with a fixed dielectric constant and a dielectric 512 formed from a ferroelectric material with a variable dielectric constant, adjacent the dielectric 510 with the fixed dielectric constant. As shown, the dielectric with the FE material 512 overlies the dielectric with the fixed dielectric constant 510. Typically a voltage is applied to a conductor in the vicinity of the FE dielectric layer 512 to create a desired dielectric constant. The voltage, represented by the "+" and "−" signs can be supplied. In some aspects, an electrical insulator (not shown) can be interposed between layer 512 and the conductive radiator 504 to isolate the bias voltage from the ac signal voltage. However, a sheet of conductor is usually required to evenly distribute the bias voltage over the FE dielectric 512 that interferes with the antenna tuning. Therefore, the dc voltage is typically superimposed upon ac signal being conducted by the radiator, and the reference ground is supplied to the counterpoise 502. Alternately but not shown, the dielectric formed with the fixed dielectric constant 510 overlies the dielectric with the ferroelectric material 512. Again, an insulator might be interposed between the FE dielectric layer 512 and the conductive counterpoise, and a reference ground supplied that is different from the voltage at the counterpoise. However as shown, the FE dielectric layer is typically biased with a reference ground supplied to the counterpoise. Note, in some aspects of the antenna the bias voltage polarities are reversed from the polarities shown.

Figure 5C:
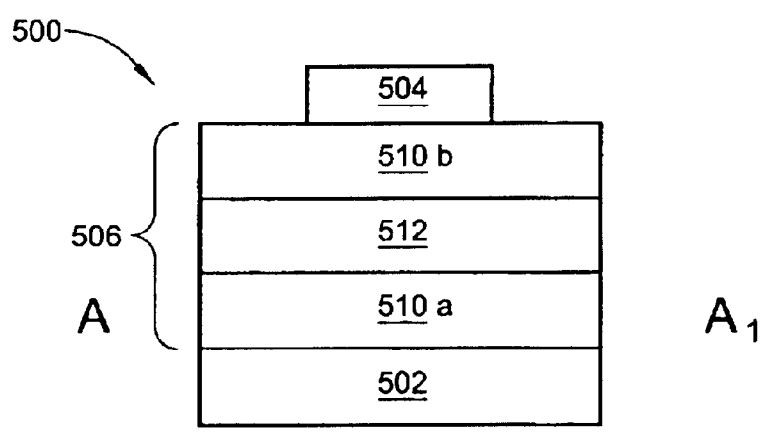

FIG. 5c is a cross-sectional drawing illustrating an alternate aspect of the microstrip slot antenna of FIG. 5a with multiple fixed dielectric constant layers. The dielectric with the fixed dielectric forms a first layer 510a underlying the dielectric with the fixed dielectric constant 512, and a second layer 510b overlies the dielectric with the ferroelectric material 512. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 5D:
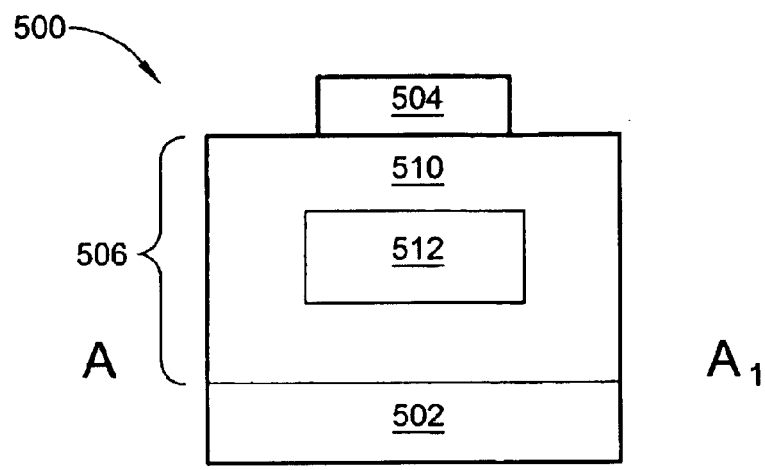

FIG. 5d is a cross-sectional drawing illustrating an alternate aspect of the microstrip slot antenna of FIG. 5a with an internal layer of FE material. As shown, the dielectric with the ferroelectric material 512 is formed internal to the dielectric 510 with the fixed dielectric constant. In some aspects, multiple FE internal regions can be formed. Alternately but not shown, the dielectric with the fixed dielectric constant 510 is formed internal to the FE dielectric 512. Again, additional electrical insulators might be used to isolate from the counterpoise 502 and radiator 504 from the FE layer 512.

In some aspects, the dielectric with ferroelectric material 512 is formed from barium strontium titanate, $Ba_xSr_{1-x}TiO_3$ (BSTO). However, alternate FE materials are well known and may perform equivalently. Returning the FIG. 5b for example, the dielectric with ferroelectric material 512 can be formed in a thin film layer having a thickness 514 in the range from 0.15 to 2 microns. Alternately, the dielectric with ferroelectric material 512 is formed in a thick film having a thickness 514 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 6A:
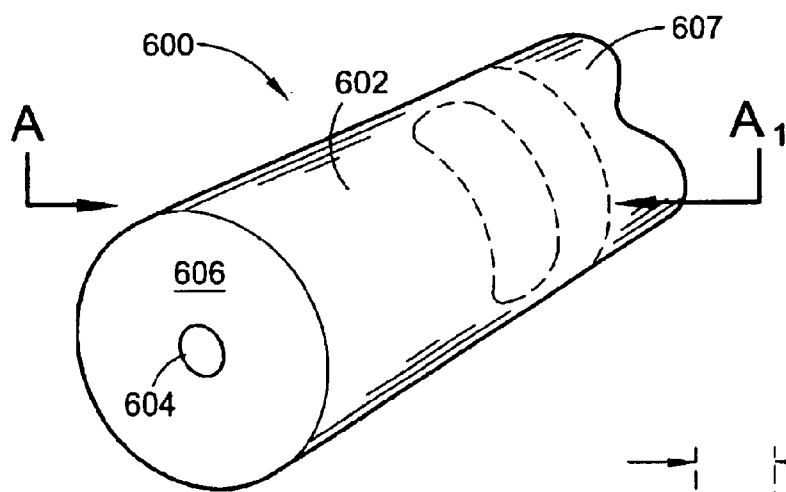

FIG. 6a is a perspective view of the present invention coaxial slot antenna 600. The counterpoise 602, radiator 604, and dielectric with FE material 606 form a coaxial line with a slot 608 in the counterpoise 602. The FE dielectric 606 is proximate to the slot 608. Away from the slot a different dielectric 607 with a fixed dielectric constant can be used. As shown, the slot 608 is transverse to the radiator 604, but it need not be. In other aspects of the coaxial slot antenna 600, a plurality of slots (not shown) are used.

Figure 6B:
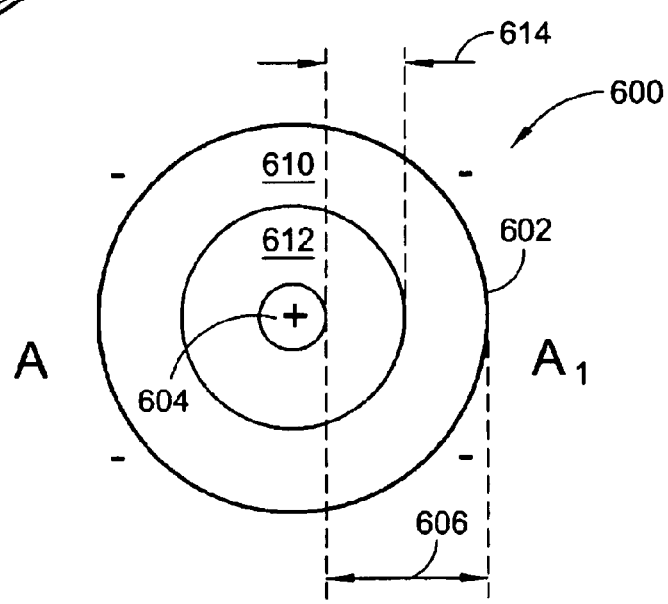

FIG. 6b is a cross-sectional drawing illustrating an alternate aspect of the coaxial slot antenna of FIG. 6a. As shown, the dielectric 606 includes at least one dielectric layer 610 formed from a first material with a fixed dielectric constant and a dielectric 612 formed from a ferroelectric material with a variable dielectric constant, adjacent the dielectric 610 with the fixed dielectric constant. As shown, the dielectric with the FE material 612 overlies the dielectric with the fixed dielectric constant 610. Typically a voltage is applied to a conductor in the vicinity of the FE dielectric layer 612 to create a desired dielectric constant. The voltage, represented by the "+" and "−" signs can be supplied. In some aspects, an electrical insulator (not shown) can be interposed between layer 612 and the conductive radiator 604 to isolate the bias voltage from the ac signal voltage. However, a sheet of conductor is usually required to evenly distribute the bias voltage over the FE dielectric 612 that interferes with the antenna tuning. Therefore, the dc voltage is typically superimposed upon ac signal being conducted by the radiator, and the reference ground is supplied to the counterpoise 602. Alternately but not shown, the dielectric formed with the fixed dielectric constant 610 overlies the dielectric with the ferroelectric material 612. Again, an insulator might be interposed between the FE dielectric layer 612 and the conductive counterpoise, and a reference ground supplied that is different from the voltage at the counterpoise. However as shown, the FE dielectric layer is typically biased with a reference ground supplied to the counterpoise. Note, in some aspects of the antenna the bias voltage polarities are reversed from the polarities shown.

Figure 6C:
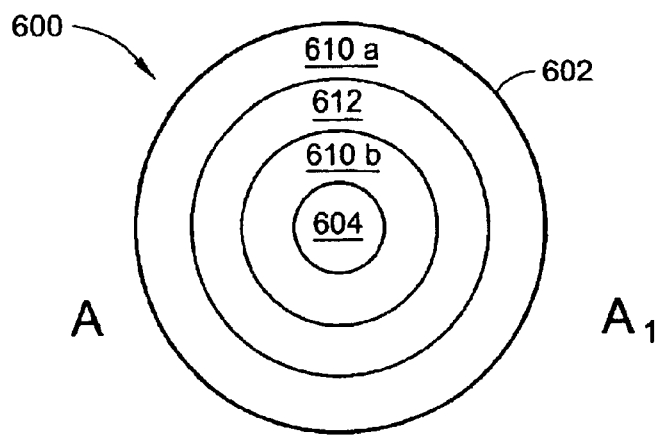

FIG. 6c is a cross-sectional drawing illustrating an alternate aspect of the coaxial slot antenna of FIG. 6a with multiple fixed dielectric constant layers. The dielectric with the fixed dielectric forms a first layer 610a underlying the dielectric with the fixed dielectric constant 612, and a second layer 610b overlies the dielectric with the ferroelectric material 612. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 6D:
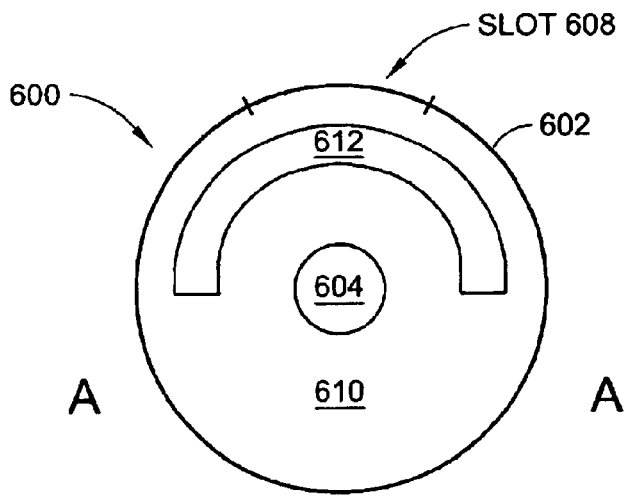

FIG. 6d is a cross-sectional drawing illustrating an alternate aspect of the coaxial slot antenna of FIG. 6a with an internal layer of FE material. As shown, the dielectric with the ferroelectric material 612 is formed internal to the dielectric 610 with the fixed dielectric constant. Note, multiple internal regions can be formed although only one is shown. Alternately but not shown, the dielectric with the fixed dielectric constant 610 is formed internal to the FE dielectric 612. Again, additional electrical insulators might be used to isolate from the counterpoise 602 and radiator 604 from the FE layer 612.

In some aspects, the dielectric with ferroelectric material 612 is formed from barium strontium titanate, $Ba_xSr_{1-x}TiO_3$ (BSTO). However, alternate FE materials are well known and may perform equivalently. Returning the FIG. 6b for example, the dielectric with ferroelectric material 612 can be formed in a thin film layer having a thickness 614 in the range from 0.15 to 2 microns. Alternately, the dielectric with ferroelectric material 612 is formed in a thick film having a thickness 614 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

FIGS. 7a through 7f are views of the present invention circular waveguide slot antenna 700. As is well known, in FIG. 7a the counterpoise and radiator are not distinctly distinguishable, therefore, the circular waveguide antenna is described as comprising a radiator 704 and dielectric 706. As shown, the slot 708 is transverse to the radiator 704, but it need not be. The FE dielectric 706 is located proximate to the slot 708. Other, fixed constant dielectric material 707 can be used away from the slot 708. In other aspects of the circular waveguide slot antenna 700, a plurality of slots (not shown) are used.

Figure 7A:
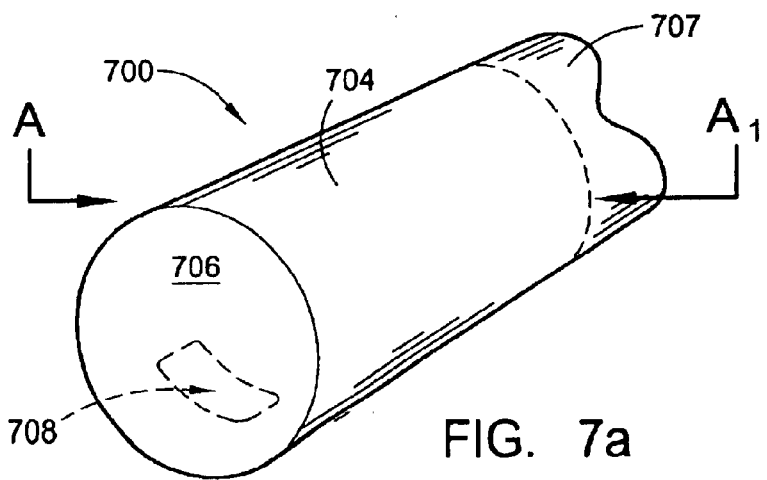
Figure 7B:
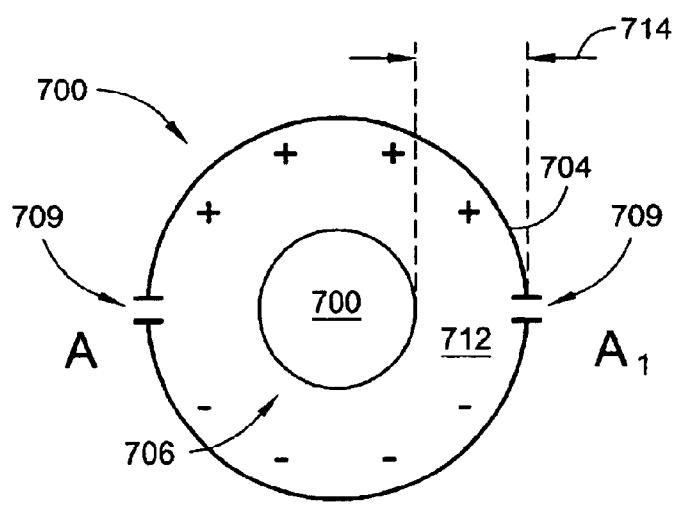

FIG. 7b is a cross-sectional drawing illustrating an alternate aspect of the circular waveguide slot antenna of FIG. 7a. As shown, the dielectric 706 includes at least one dielectric layer 710 formed from a first material with a fixed dielectric constant and a dielectric 712 formed from a ferroelectric material with a variable dielectric constant, adjacent the dielectric 710 with the fixed dielectric constant. As shown, the dielectric with the FE material 712 overlies the dielectric with the fixed dielectric constant 710. Typically a voltage is applied to a conductor in the vicinity of the FE dielectric layer 712 to create a desired dielectric constant. The voltage, represented by the "+" and "−" signs can be supplied. In some aspects, an electrical insulator (not shown) can be interposed between layer 712 and the conductive radiator 704 to isolate the bias voltage from the ac signal voltage. However, a sheet of conductor is usually required to evenly distribute the bias voltage over the FE dielectric 712 that interferes with the antenna tuning. Therefore, slits 709 can be formed in the radiator 704 to separate the two bias voltage polarities. The dc voltages are typically superimposed upon ac signal being conducted by the radiator halves. Alternately but not shown, the dielectric formed with the fixed dielectric constant 710 overlies the dielectric with the ferroelectric material 712. Note, in some aspects of the antenna the bias voltage polarities are reversed from the polarities shown.

Figure 7E:
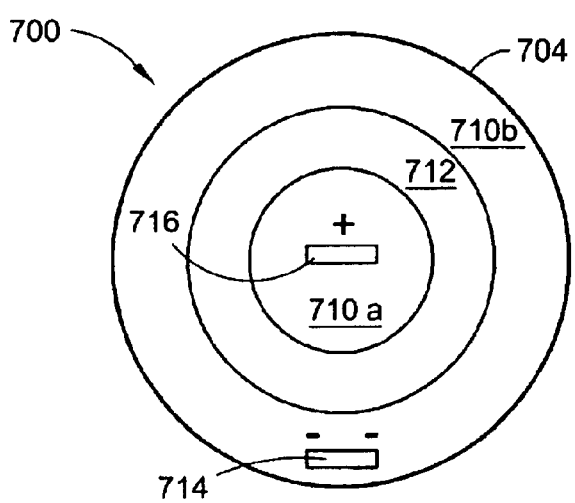
Figure 7F:
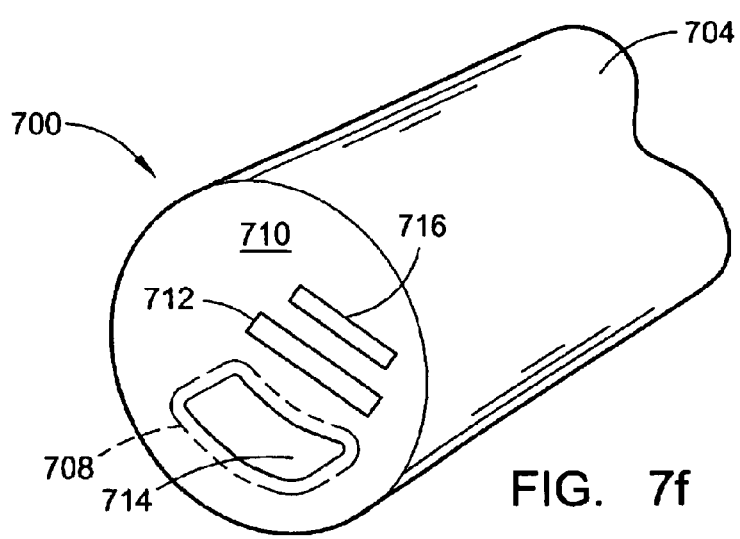
Figure 7C:
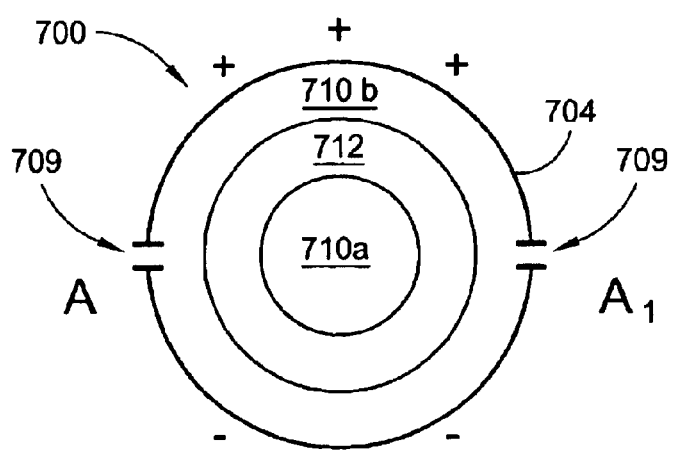

FIG. 7c is a cross-sectional drawing illustrating an alternate aspect of the circular waveguide slot antenna of FIG. 7a with multiple fixed dielectric constant layers. The dielectric with the fixed dielectric forms a first layer 710a underlying the dielectric with the fixed dielectric constant 712, and a second layer 710b overlies the dielectric with the ferroelectric material 712. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 7D:
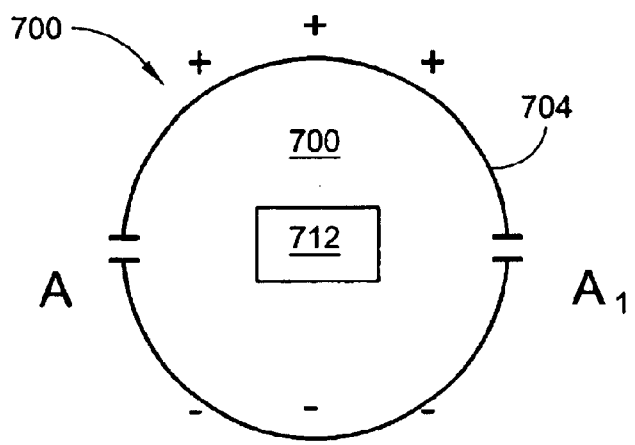

FIG. 7d is a cross-sectional drawing illustrating an alternate aspect of the circular waveguide slot antenna of FIG. 7a with an internal layer of FE material. As shown, the dielectric with the ferroelectric material 712 is formed internal to the dielectric 710 with the fixed dielectric constant. Note, multiple internal regions can be formed although only one is shown. Alternately but not shown, the dielectric with the fixed dielectric constant 710 is formed internal to the FE dielectric 712. It should also be noted that although the internal region is shown as rectangularly shaped, other shapes such as circular, cylindrical, and oval shapes are equally practical.

FIGS. 7e and 7f are alternate aspects of the circular waveguide slot antenna 700. The slits are not necessary because the radiator 704 need not carry a bias voltage. Instead the bias voltage is supplied by panels 714 and 716. The bias panels 714/716 can be placed in a variety of positions on either side of the FE dielectric. One panel may even be located in the slot.

In some aspects, the dielectric with ferroelectric material 712 is formed from barium strontium titanate, $Ba_xSr_{1-x}TiO_3$ (BSTO). However, alternate FE materials are well known and may perform equivalently. Returning the FIG. 7b for example, the dielectric with ferroelectric material 712 can be formed in a thin film layer having a thickness 714 in the range from 0.15 to 2 microns. Alternately, the dielectric with ferroelectric material 712 is formed in a thick film having a thickness 714 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 8A:
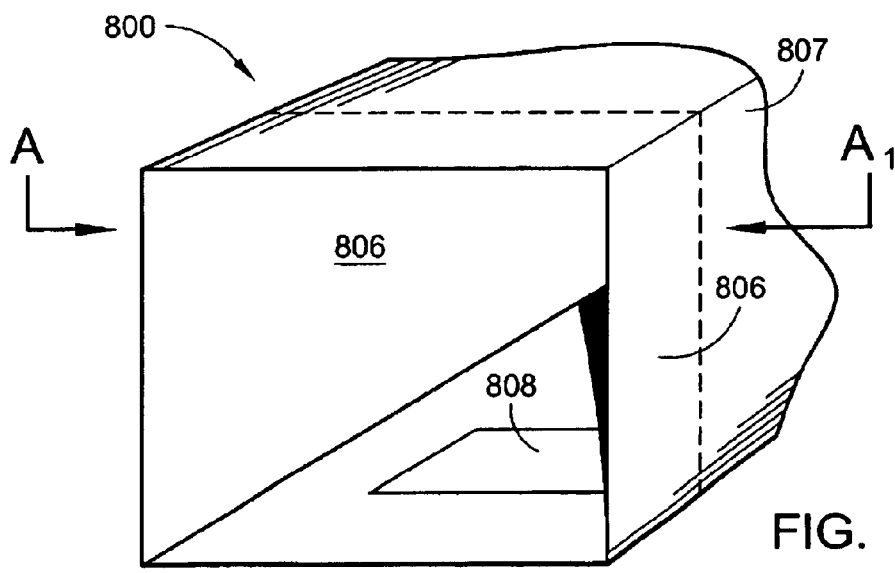

FIG. 8a is a perspective view of the present invention rectangular waveguide slot antenna 800. The rectangular waveguide antenna is described as comprising a radiator 804 and dielectric 806. However, the designations of radiator and counterpoise are arbitrary. As shown, the slot 808 is transverse to the radiator 804, but it need not be. The FE dielectric 806 is located proximate to the slot 808. Away from the slot 808, a fixed constant dielectric 807 may be used. In other aspects of the rectangular waveguide slot antenna 800, a plurality of slots (not shown) are used.

Figure 8B:
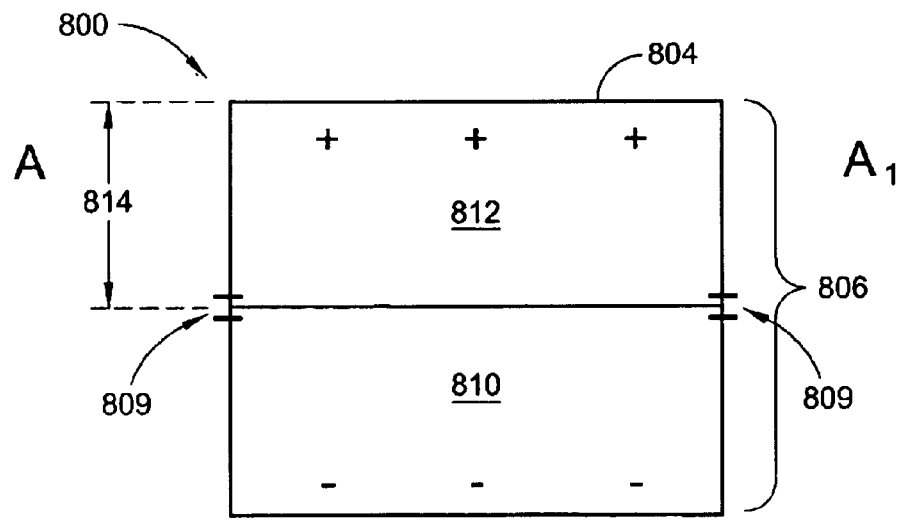

FIG. 8b is a cross-sectional drawing illustrating an alternate aspect of the rectangular waveguide slot antenna of FIG. 8a. As shown, the dielectric 806 includes at least one dielectric layer 810 formed from a first material with a fixed dielectric constant and a dielectric 812 formed from a ferroelectric material with a variable dielectric constant, adjacent the dielectric 810 with the fixed dielectric constant. As shown, the dielectric with the FE material 812 overlies the dielectric with the fixed dielectric constant 810. Typically a voltage is applied to a conductor in the vicinity of the FE dielectric layer 812 to create a desired dielectric constant. The voltage, represented by the "+" and "−" signs can be supplied. In some aspects, an electrical insulator (not shown) can be interposed between layer 812 and the conductive radiator 804 to isolate the bias voltage from the ac signal voltage. However, a sheet of conductor is usually required to evenly distribute the bias voltage over the FE dielectric 812 that interferes with the antenna tuning. Therefore, (electrically isolating) slits 809 can be formed in the radiator 804 to separate the two bias voltage polarities. The dc voltages are typically superimposed upon ac signal being conducted by the radiator halves. Alternately but not shown, the dielectric formed with the fixed dielectric constant 810 overlies the dielectric with the ferroelectric material 812. Note, in some aspects of the antenna the bias voltage polarities are reversed from the polarities shown.

Figure 8C:
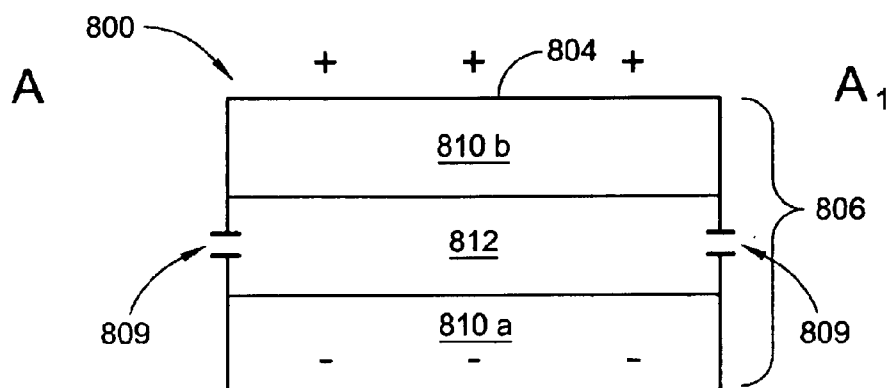

FIG. 8c is a cross-sectional drawing illustrating an alternate aspect of the rectangular waveguide slot antenna of FIG. 8a with multiple fixed dielectric constant layers. The dielectric with the fixed dielectric forms a first layer 810a underlying the dielectric with the fixed dielectric constant 812, and a second layer 810b overlies the dielectric with the ferroelectric material 812. The two fixed dielectric layers need not necessarily have the same dielectric constant or thickness. Further, three or more fixed dielectric layers may be used. Alternately but not shown, multiple FE layers can be formed around a fixed dielectric layer, or. multiple layers of both fixed dielectric and FE layers can be used. The multiple FE dielectric layers may have different thickness, be made of different FE materials, or otherwise have different dielectric constants with respect to the same voltage.

Figure 8D:
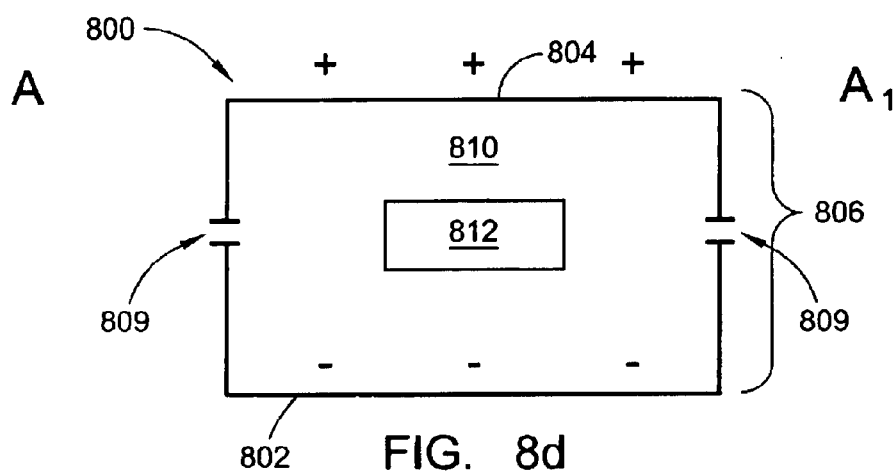

FIG. 8d is a cross-sectional drawing illustrating an alternate aspect of the rectangular waveguide slot antenna of FIG. 8a with an internal layer of FE material. As shown, the dielectric with the ferroelectric material 812 is formed internal to the dielectric 810 with the fixed dielectric constant. Note, multiple internal regions can be formed although only one is shown. Alternately but not shown, the dielectric with the fixed dielectric constant 810 is formed internal to the FE dielectric 812. It should also be noted that although the internal region is shown as rectangularly shaped, other shapes such as circular, cylindrical, and oval shapes are equally practical In another variation not shown, equivalent to FIGS. 7e and 7f, the dc bias voltage is supplied by panels interior to the radiator 804, so that the slits 809 need not be formed.

In some aspects, the dielectric with ferroelectric material 812 is formed from barium strontium titanate, $Ba_xSr_{1-x}TiO_3$ (BSTO). However, alternate FE materials are well known and may perform equivalently. Returning the FIG. 8b for example, the dielectric with ferroelectric material 812 can be formed in a thin film layer having a thickness 814 in the range from 0.15 to 2 microns. Alternately, the dielectric with ferroelectric material 812 is formed in a thick film having a thickness 814 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 9A:
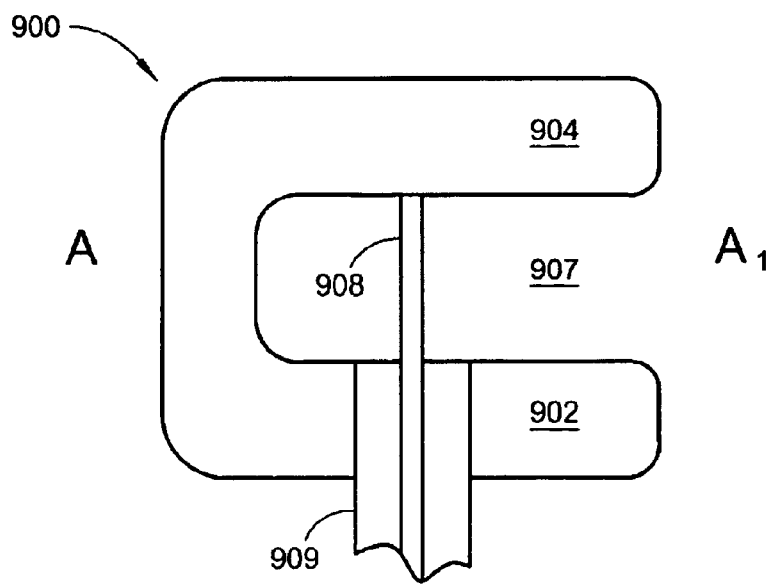
Figure 9B:
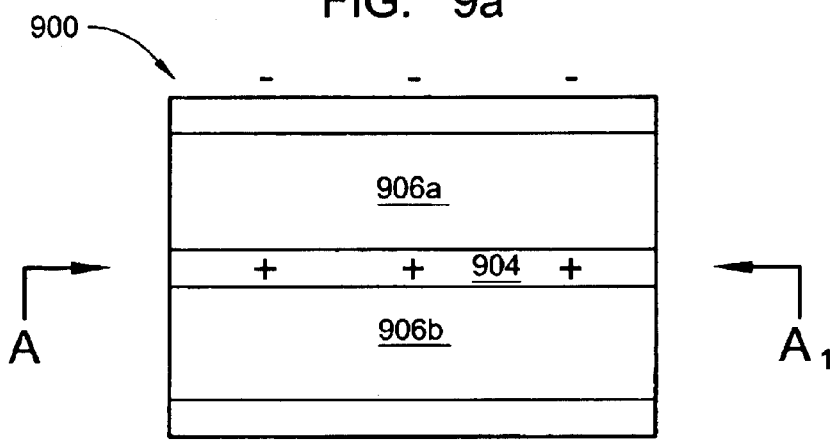

FIGS. 9a and 9b are partial cross-sectional and plan views, respectively, of the present invention flare-notch antenna. The flare-notch antenna 900 comprises a counterpoise 902, a radiator 904, and a dielectric 906a and 906a, at least one of which including FE material. The designation of counterpoise and radiator may be considered arbitrary. A slot or notch 907 is shown. The FE dielectric 906a and 906b are proximately located to the notch 907. Also shown is a feed with a center conductor 908 and a ground 909.

Figure 9C:
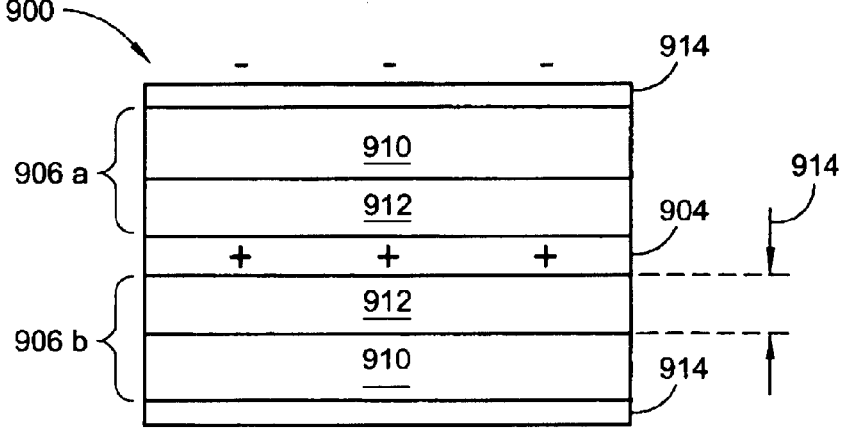

FIG. 9c is an alternate aspect of the flare-notch antenna of FIG. 9b. As shown, the dielectric 906a and 906b includes at least one dielectric layer 910 formed from a first material with a fixed dielectric constant and a dielectric 912 formed from a ferroelectric material with a variable dielectric constant, adjacent the dielectric 910 with the fixed dielectric constant. As shown, the dielectric with the FE material 912 overlies the dielectric with the fixed dielectric constant 910. Typically a voltage is applied to a conductor in the vicinity of the FE dielectric layer 912 to create a desired dielectric constant. The voltage, represented by the "+" and "−" signs can be supplied. In some aspects, an electrical insulator (not shown) can be interposed between layer 912 and the radiator/counterpoise 904/902 to isolate the bias voltage from the ac signal voltage. However, a sheet of conductor is usually required to evenly distribute the bias voltage over the FE dielectric 912 that interferes with the antenna tuning. Therefore, the dc voltage is typically superimposed upon ac signal being conducted by the radiator/counterpoise 904/902, and the reference ground is supplied to conductive panels 914. Alternately but not shown, the dielectric formed with the fixed dielectric constant 910 overlies the dielectric with the ferroelectric material 912. Note, in some aspects of the antenna the bias voltage polarities are reversed from the polarity shown.

Figure 9D:
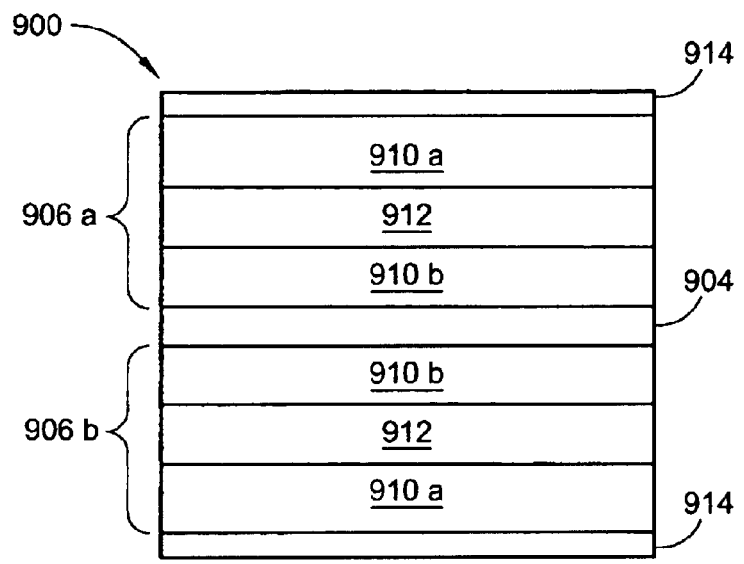

FIG. 9d is a plan view illustrating an alternate aspect of the flare-notch antenna of FIG. 9b with multiple fixed dielectric constant layers. The dielectric with the fixed dielectric forms a first layer 910a underlying the dielectric with the fixed dielectric constant 912, and a second layer 910b overlies the dielectric with the ferroelectric material 912. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 9E:
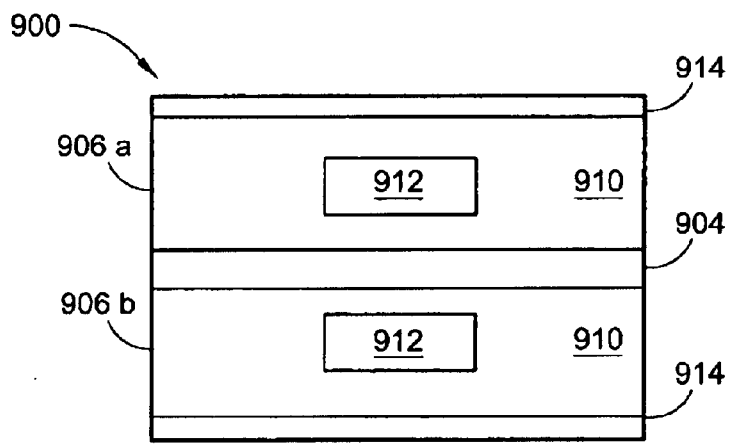

FIG. 9e is a plan view illustrating an alternate aspect of the flare-notch antenna of FIG. 9b with an internal layer of FE material. As shown, the dielectric with the ferroelectric material 912 is formed internal to the dielectric 910 with the fixed dielectric constant. Note, multiple internal regions can be formed although only one is shown. Alternately but not shown, the dielectric with the fixed dielectric constant 910 is formed internal to the FE dielectric 912. It should also be noted that although the internal region is shown as rectangularly shaped, other shapes such as circular, cylindrical, and oval shapes are equally practical. In another variation not shown, the FE material forms internal regions on only one side of the radiator, for example is dielectric 906a.

In some aspects, the dielectric with ferroelectric material 912 is formed from barium strontium titanate, $Ba_xSr_{1-x}TiO_3$ (BSTO). However, alternate FE materials are well known and may perform equivalently. Returning the FIG. 9c for example, the dielectric with ferroelectric material 912 can be formed in a thin film layer having a thickness 914 in the range from 0.15 to 2 microns. Alternately, the dielectric with ferroelectric material 912 is formed in a thick film having a thickness 914 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 10A:
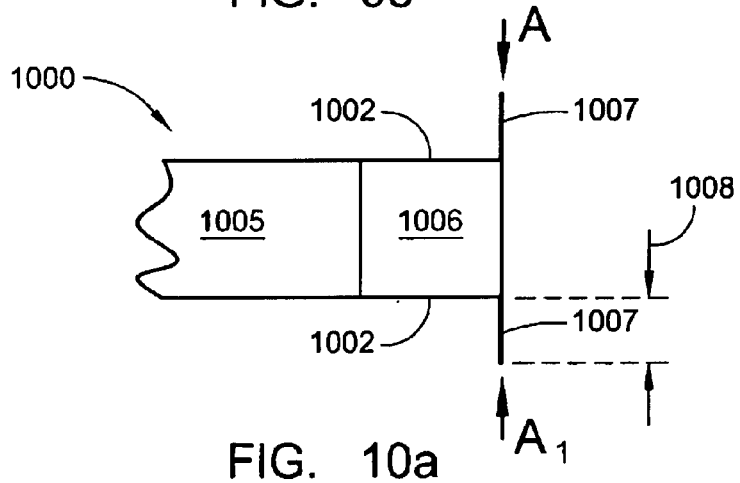
FIGS. 10a though 10d are illustrations of the present invention open-ended waveguide antenna.

FIGS. 10a though 10d are illustrations of the present invention open-ended waveguide antenna 1000. FIG. 10a is a partial cross-sectional view of the present invention open-ended waveguide antenna with a selectable operating frequency. The open-ended waveguide antenna 1000 comprises a radiator 1002 and a dielectric 1006 with ferroelectric material proximately located to the radiator 1002. The dielectric 1006 has a varying dielectric constant responsive to a voltage applied to the ferroelectric material. The designations of counterpoise and radiator are arbitrary. Typically, the open ends 1007 are grounded. Away from the open ends 107 a constant dielectric material 1005 can be used. The principles and design of open-ended antennas are well understood by those skilled in the art and are not repeated here in the interest of brevity. Although the use of FE material gives an, open-ended antenna a wider range of selectable operating frequencies, the general principles of design are not changed by the present invention FE material.

The antenna 1000 has a predetermined fixed characteristic impedance independent of the resonant frequency. Alternately stated, the antenna 1000 has a predetermined approximately constant gain independent of the resonant frequency.

Figure 10B:
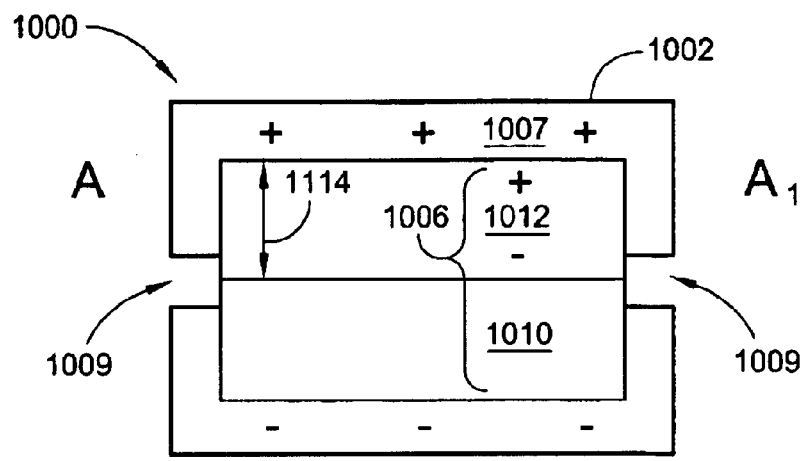

FIG. 10b is a cross-sectional drawing illustrating an alternate aspect of the open-ended waveguide antenna of FIG. 10a. As shown, the dielectric 1006 includes at least one dielectric layer 1010 formed from a first material with a fixed dielectric constant and a dielectric 1012 formed from a ferroelectric material with a variable dielectric constant, adjacent the dielectric 1010 with the fixed dielectric constant. As shown, the dielectric with the FE material 1012 overlies the dielectric with the fixed dielectric constant 1010. Typically a voltage is applied to a conductor in the vicinity of the FE dielectric layer 1012 to create a desired dielectric constant. The voltage, represented by the "+" and "−" signs can be supplied. In some aspects, an electrical insulator (not shown) can be interposed between layer 1012 and the radiator 1002 to isolate the bias voltage from the ac signal voltage. However, a sheet of conductor is usually required to evenly distribute the bias voltage over the FE dielectric 1012 that interferes with the antenna tuning. Therefore, electrically isolating slits 1009 can be formed in the radiator 1002 to separate the two bias voltage polarities. The dc voltages are typically superimposed upon ac signal being conducted by the radiator halves. Alternately but not shown, the dielectric formed with the fixed dielectric constant 1010 overlies the dielectric with the ferroelectric material 1012. Note, in some aspects of the antenna the bias voltage polarities are reversed from the polarity shown.

Figure 10C:
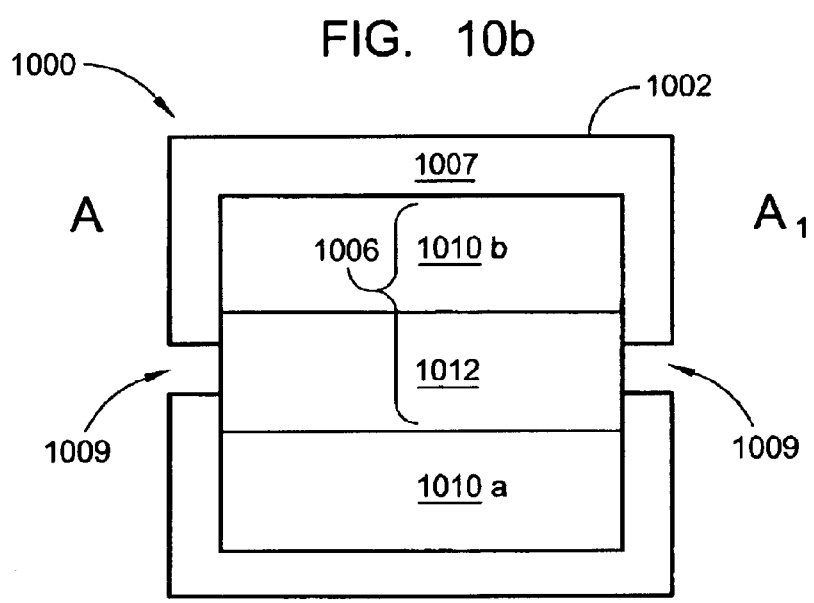

FIG. 10c is a cross-sectional drawing illustrating an alternate aspect of the open-ended waveguide antenna of FIG. 10a with multiple fixed dielectric constant layers. The dielectric with the fixed dielectric forms a first layer 1010a underlying the dielectric with the fixed dielectric constant 1012, and a second layer 1010b overlies the dielectric with the ferroelectric material 1012. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 10D:
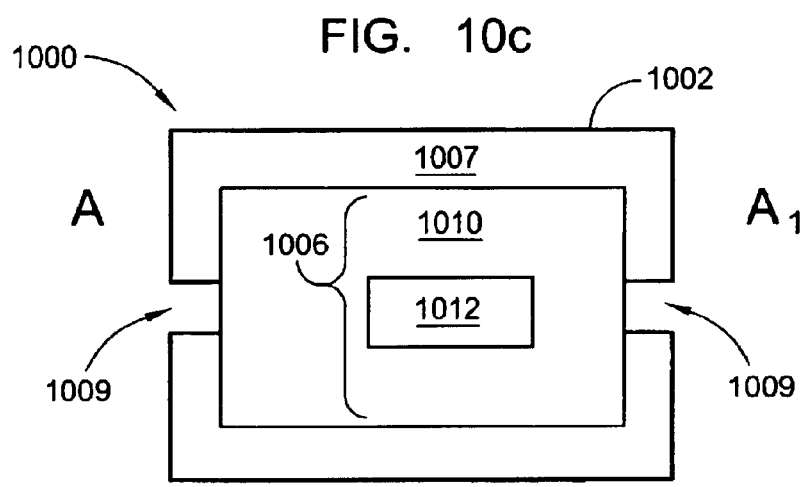

FIG. 10d is a cross-sectional drawing illustrating an alternate aspect of the open-ended waveguide antenna of FIG. 10a with an internal layer of FE material. As shown, the dielectric with the ferroelectric material 1012 is formed internal to the dielectric 1010 with the fixed dielectric constant. Note, multiple internal regions can be formed although only one is shown. Alternately but not shown, the dielectric with the fixed dielectric constant 1010 is formed internal to the FE dielectric 1012. It should also be noted that although the internal region is shown as rectangularly shaped, other shapes such as circular, cylindrical, and oval shapes are equally practical. In another variation not shown, equivalent to FIGS. 7e and 7f, the dc bias voltage is supplied by panels interior to the radiator 1002, so that the slits 1009 need not be formed.

In some aspects, the dielectric with ferroelectric material 1012 is formed from barium strontium titanate, $Ba_xSr_{1-x}TiO_3$ (BSTO). However, alternate FE materials are well known and may perform equivalently. Returning the FIG. 10b for example, the dielectric with ferroelectric material 1012 is formed in a thin film layer having a thickness 1014 in the range from 0.15 to 2 microns. Alternately, the dielectric with ferroelectric material 1012 is formed in a thick film having a thickness 1014 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Returning to FIGS. 10a and 10b, although an open-ended rectangular waveguide has been depicted, the above analysis and description applies to open-ended circular waveguide and open-ended parallel plate antennas. Further, the open-ended waveguide antenna 1000 can have a signal feed elected that is a coaxial cable, parallel plates, or any kind of waveguide.

Figure 11A:
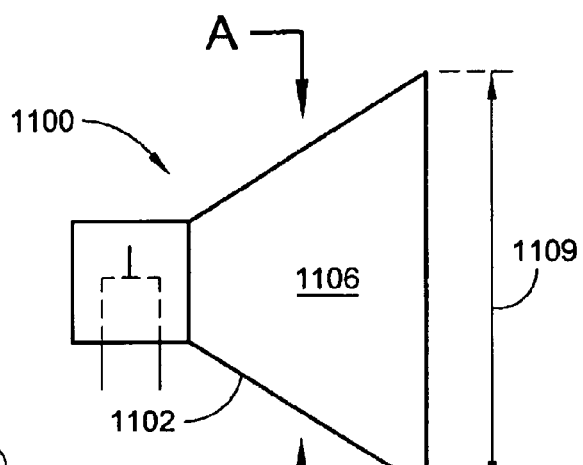
FIGS. 11a through 11e are views of the present invention horn antenna with a selectable operating frequency.

FIGS. 11a through 11e are views of the present invention horn antenna with a selectable operating frequency. As seen in FIG. 11a, the horn antenna 1100 comprises a radiator horn 1102 and a dielectric 1106 with ferroelectric material proximately located to the radiator horn. The dielectric 1006 has a varying dielectric constant responsive to a voltage applied to the ferroelectric material. A coaxial feed line 1004 with a center conductor 1005 is shown. The horn 1002 has an electrical length 1109 responsive to the dielectric constant. The electrical length is constant with respect to the resonant frequency. The horn can be either grounded or open. Again the designations of counterpoise and radiator are arbitrary. The principles and design of horn antennas are well understood by those skilled in the art and are not repeated here in the interest of brevity. Although the use of FE material gives a horn antenna a wider range of selectable operating frequencies, the general principles of design are not changed by the present invention FE material.

The horn antenna 1100 has a predetermined fixed characteristic impedance independent of the resonant frequency. Alternately, the horn antenna 1100 has a predetermined approximately constant gain independent of the resonant frequency.

Figure 11B:
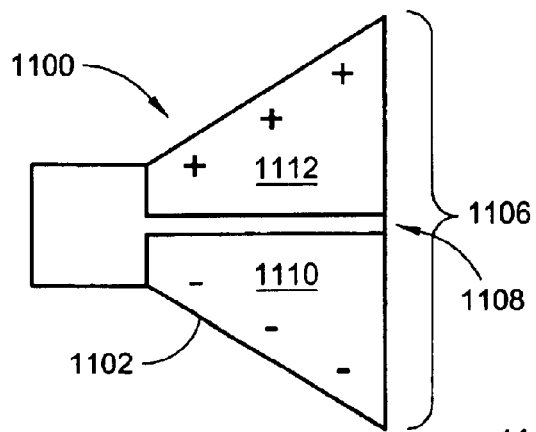

FIG. 11b is a cross-sectional drawing illustrating an alternate aspect of the horn antenna of FIG. 11a. As shown, the dielectric 1106 includes at least one dielectric layer 1110 formed from a first material with a fixed dielectric constant and a dielectric 1112 formed from a ferroelectric material with a variable dielectric constant, adjacent the dielectric 1110 with the fixed dielectric constant. As shown, the dielectric with the FE material 1112 overlies the dielectric with the fixed dielectric constant 1110. Typically a voltage is applied to a conductor in the vicinity of the FE dielectric layer 1112 to create a desired dielectric constant. The voltage, represented by the "+" and "−" signs can be supplied. In some aspects, an electrical insulator (not shown) can be interposed between layer 1112 and the radiator horn 1102 to isolate the bias voltage from the ac signal voltage. However, a sheet of conductor is usually required to evenly distribute the bias voltage over the FE dielectric 1112 that interferes with the antenna tuning. Therefore, electrically isolating slits 1108 can be formed in the radiator 1102 to separate the two bias voltage polarities. The dc voltages are typically superimposed upon ac signal being conducted by the radiator halves. Alternately but not shown, the dielectric formed with the fixed dielectric constant 1110 overlies the dielectric with the ferroelectric material 1112. Note, in some aspects of the antenna the bias voltage polarities are reversed from the polarities shown.

Figure 11C:
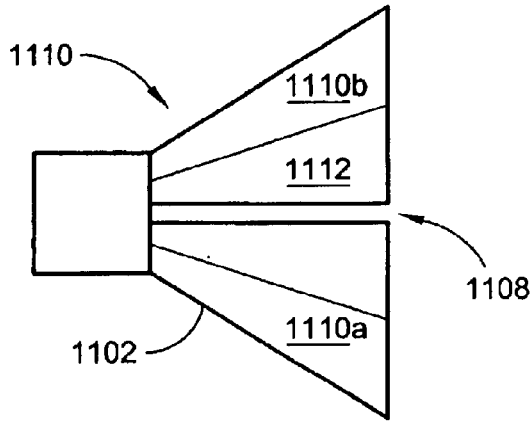
Figure 11D:
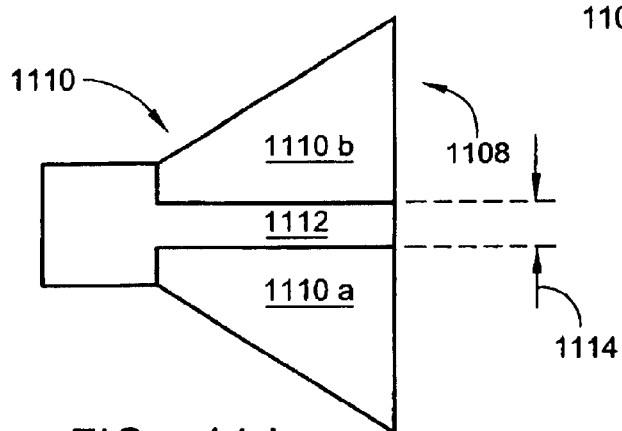

FIGS. 11c and 11d are cross-sectional drawings illustrating an alternate aspect of the horn antenna 1100 of FIG. 11a with multiple fixed dielectric constant layers. The dielectric with the fixed dielectric forms a first layer 1110a underlying the dielectric with the fixed dielectric constant 1112, and a second layer 1110b overlies the dielectric with the ferroelectric material 1112. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 11E:
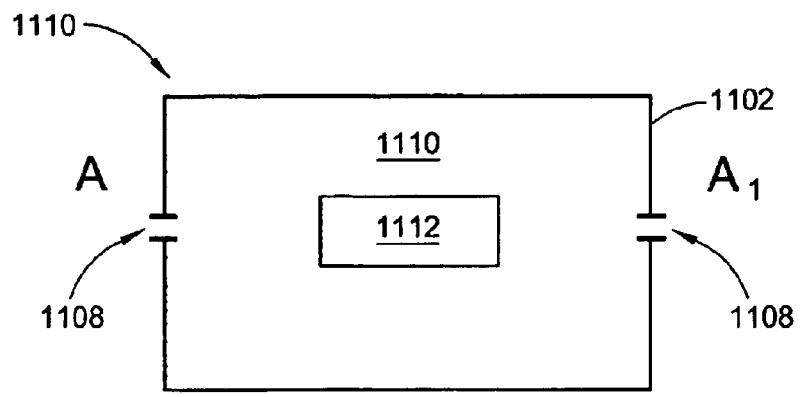

FIG. 11e is a cross-sectional drawing illustrating an alternate aspect of the horn antenna of FIG. 11a with an internal layer of FE material. As shown, the dielectric with the ferroelectric material 1112 is formed internal to the dielectric 1110 with the fixed dielectric constant. Note, multiple internal regions can be formed although only one is shown. Alternately but not shown, the dielectric with the fixed dielectric constant 1110 is formed internal to the FE dielectric 1112. It should also be noted that although the internal region is shown as rectangularly shaped, other shapes such as circular, cylindrical, and oval shapes are equally practical. In another variation not shown, equivalent to FIGS. 7e and 7f, the dc bias voltage is supplied by panels interior to the radiator 1002, so that the slits 1108 need not be formed.

In some aspects, the dielectric with ferroelectric material 1112 is formed from barium strontium titanate, $Ba_xSr_{1-x}TiO_3$ (BSTO). However, alternate FE materials are well known and may perform equivalently. Returning the FIG. 11d for example, the dielectric with ferroelectric material 1112 can be formed in a thin film layer having a thickness 1114 in the range from 0.15 to 2 microns. Alternately, the dielectric with ferroelectric material 1112 is formed in a thick film having a thickness 1114 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Returning to FIG. 11a, the above discussion of horn antennas applies equally to rectangular waveguide, circular waveguide, and parallel plate horn antennas using a signal feed from a coaxial cable, circular waveguide, rectangular waveguide, or a parallel plate signal feed.

Figure 12A:
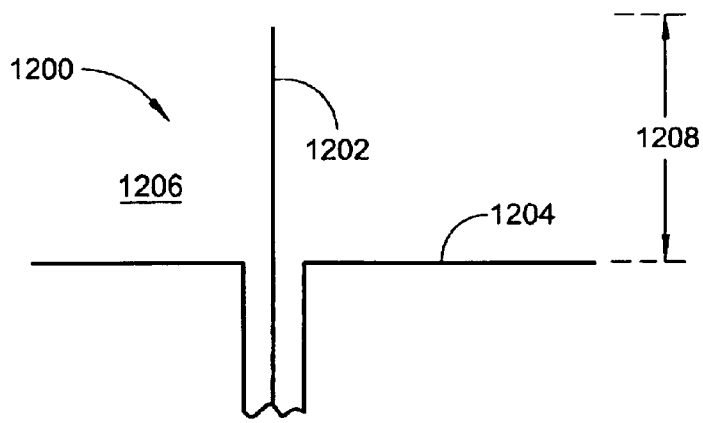

FIGS. 12a through 12f are depictions of the present invention monopole antenna with a selectable operating frequency. In FIG. 12a, the monopole antenna 1200 comprises a radiator 1202, a counterpoise 1204, and a dielectric 1206 at least partially surrounding the radiator 1202. The dielectric includes ferroelectric material having a varying dielectric constant responsive to a voltage applied to the ferroelectric material. The radiator 1202 has an electrical length 1208 responsive to the dielectric constant. Alternately but not shown, the radiator 1202 can be formed in a helical shape. The principles and design of monopole antennas are well understood by those skilled in the art and are not repeated here in the interest of brevity. Although the use of FE material gives a monopole antenna a wider range of selectable operating frequencies, the general principles of design are not changed by the present invention FE material.

The antenna 1200 has a predetermined fixed characteristic impedance independent of the resonant frequency. That is, the electrical length of the radiator is constant with respect to the resonant frequency. Alternately, the antenna 1200 has a predetermined approximately constant gain independent of the resonant frequency.

Figure 12B:
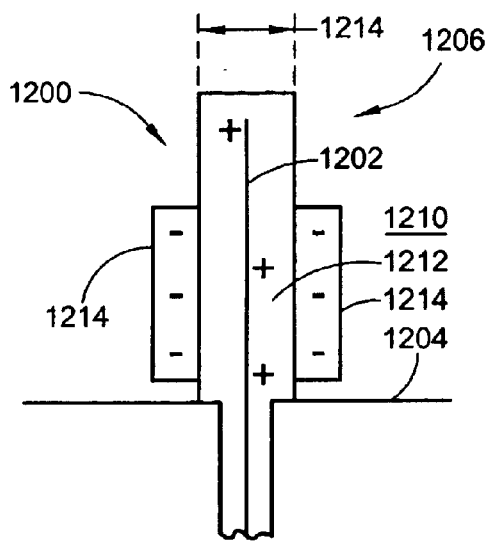

FIG. 12b is a drawing illustrating an alternate aspect of the monopole antenna of FIG. 12a. As shown, the dielectric 1206 includes at least one dielectric layer 1210 formed from a first material with a fixed dielectric constant and a dielectric 1212 formed from a ferroelectric material with a variable dielectric constant, adjacent the dielectric 1210 with the fixed dielectric constant. As shown, the dielectric with the FE material 1212 overlies the dielectric with the fixed dielectric constant 1210. Typically a voltage is applied to a conductor in the vicinity of the FE dielectric layer 1212 to create a desired dielectric constant. The voltage, represented by the "+" and "−" signs can be supplied. In some aspects, an electrical insulator (not shown) can be interposed between layer 1212 and the radiator 1202 to isolate the bias voltage from the ac signal voltage. However, a sheet of conductor is usually required to evenly distribute the bias voltage over the FE dielectric 1212 that interferes with the antenna tuning. Therefore, the dc voltage is typically superimposed upon ac signal being conducted by the radiator 1202, and the reference ground is supplied to conductive panels 1214. Note, in some aspects of the antenna the bias voltage polarities are reversed. In other aspects, the radiator 1202 does not carry a dc bias, the two bias polarities are carried instead by panels 1214.

Figure 12C:
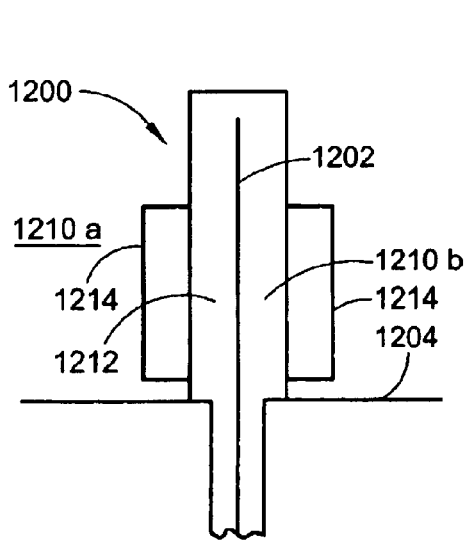

FIG. 12c is a drawing illustrating an alternate aspect of the monopole antenna 1200 of FIG. 12a with multiple fixed dielectric constant layers. The dielectric with the fixed dielectric forms a first layer 1210a underlying the dielectric with the fixed dielectric constant 1212, and a second layer 1210b overlies the dielectric with the ferroelectric material 1212. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

FIG. 12d is a drawing illustrating an alternate aspect of the monopole antenna of FIG. 12a with an internal layer of FE material. As shown, the dielectric with the ferroelectric material 1212 is formed internal to the dielectric 1210 with the fixed dielectric constant. Note, multiple internal regions can be formed although only one is shown. Alternately but not shown, the dielectric with the fixed dielectric constant 1210 is formed internal to the FE dielectric 1212. It should also be noted that although the internal region is shown as rectangularly shaped, other shapes such as circular, cylindrical, and oval shapes are equally practical.

FIGS. 12e and 12f illustrate some alternate aspects of the present invention monopole antenna.

In some aspects, the dielectric with ferroelectric material 1212 is formed from barium strontium titanate, $Ba_xSr_{1-x}TiO_3$ (BSTO). However, alternate FE materials are well known and may perform equivalently. Returning the FIG. 12b for example, the dielectric with ferroelectric material 1212 can be formed in a thin film layer having a thickness 1214 in the range from 0.15 to 2 microns. Alternately, the dielectric with ferroelectric material 1212 is formed in a thick film having a thickness 1214 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 13C:
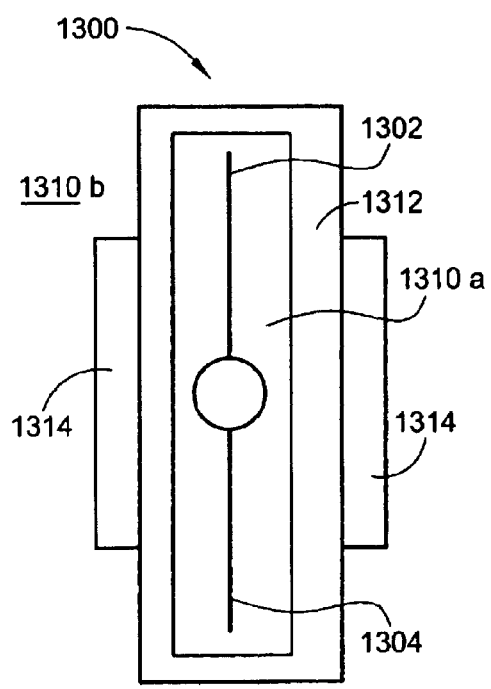

FIGS. 13a through 13f are drawings of the present invention dipole antenna with a selectable operating frequency. In FIG. 13a, the dipole antenna 1300 comprises a radiator 1302, a counterpoise 1304, and a dielectric 1306 at least partially surrounding the radiator 1302. The dielectric 1306 includes ferroelectric material having a varying dielectric constant responsive to a voltage applied to the ferroelectric material. The radiator and counterpoise have electrical lengths 1308 that are responsive to the varying dielectric constant. Alternately but not shown, the radiator 1302, the counterpoise 1304, or both can be formed in a helical shape. The principles and design of dipole antennas are well understood by those skilled in the art and are not repeated here in the interest of brevity. Although the use of FE material gives a dipole antenna a wider range of selectable operating frequencies, the general principles of design are not changed by the present invention FE material.

The antenna 1300 has a predetermined fixed characteristic impedance independent of the resonant frequency. That is, the radiator and counterpoise electrical lengths remain constant with respect to resonant frequency. Typically, the electrical length of the radiator 1302 and counterpoise 1304 are either one-half or one-quarter the wavelength of the resonant frequency with respect to the dielectric. Alternately, the antenna has a predetermined approximately constant gain independent of the resonant frequency.

FIG. 13b is a drawing illustrating an alternate aspect of the monopole antenna of FIG. 13a. As shown, the dielectric 1306 includes at least one dielectric layer 1310 formed from a first material with a fixed dielectric constant and a dielectric 1312 formed from a ferroelectric material with a variable dielectric constant, adjacent the dielectric 1310 with the fixed dielectric constant. As shown, the dielectric with the FE material 1312 overlies the dielectric with the fixed dielectric constant 1310. Typically a voltage is applied to a conductor in the vicinity of the FE dielectric layer 1312 to create a desired dielectric constant. The voltage, represented by the "+" and "−" signs can be supplied. In some aspects, an electrical insulator (not shown) can be interposed between layer 1312 and the radiator 1302 to isolate the bias voltage from the ac signal voltage. However, a sheet of conductor is usually required to evenly distribute the bias voltage over the FE dielectric 1312 that interferes with the antenna tuning. Therefore, the dc voltage is typically superimposed upon ac signal being conducted by the radiator 1302, and the reference ground is supplied to conductive panels 1314. Note, in some aspects of the antenna the bias voltage polarities are reversed. In other aspects, the radiator 1302 does not carry a dc bias, the two bias polarities are carried instead by panels 1314.

FIG. 13c is a drawing illustrating an alternate aspect of the monopole antenna 1300 of FIG. 13a with multiple fixed dielectric constant layers. The dielectric with the fixed dielectric forms a first layer 1310a underlying the dielectric with the fixed dielectric constant 1312, and a second layer 1310b overlies the dielectric with the ferroelectric material 1312. The two fixed dielectric layers need not necessarily have the same dielectric constant or thickness. Further, three or more fixed dielectric layers may be used. Alternately but not shown, multiple FE layers can be formed around a fixed dielectric layer, or multiple layers of both fixed dielectric and FE layers can be used. The multiple FE dielectric layers may have different thickness, be made of different FE materials, or otherwise have different dielectric constants with respect to the same voltage.

Figure 13E:
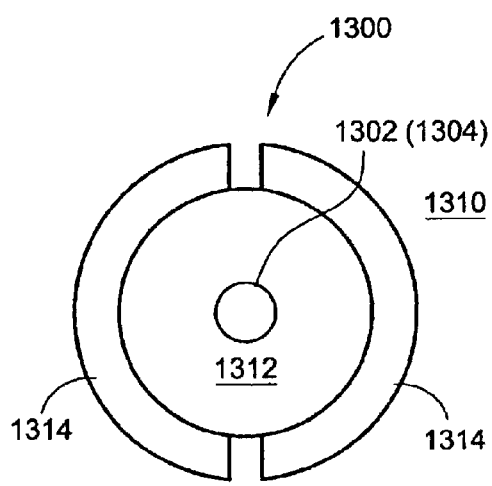
Figure 13D:
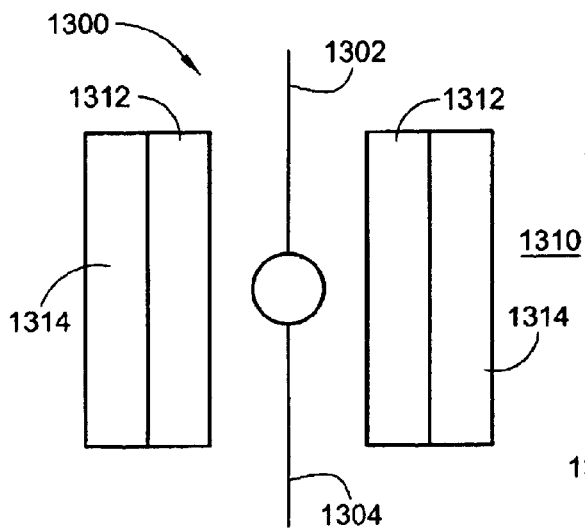

FIG. 13d is a drawing illustrating an alternate aspect of the monopole antenna of FIG. 13a with an internal layer of FE material. As shown, the dielectric with the ferroelectric material 1312 is formed internal to the dielectric 1310 with the fixed dielectric constant. Note, multiple internal regions can be formed although only one is shown. Alternately but not shown, the dielectric with the fixed dielectric constant 1310 is formed internal to the FE dielectric 1312. It should also be noted that although the internal region is shown as rectangularly shaped, other shapes such as circular, cylindrical, and oval shapes are equally practical.

Figure 13F:
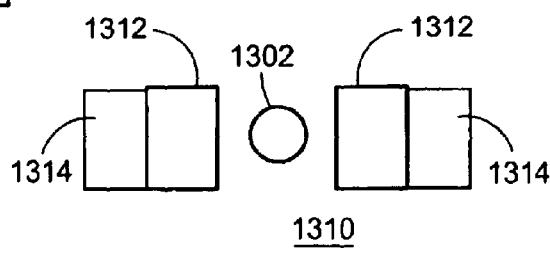

FIGS. 13e and 13f illustrate some alternate aspects of the present invention monopole antenna.

In some aspects, the dielectric with ferroelectric material 1212 is formed from barium strontium titanate, $Ba_xSr_{1-x}TiO_3$ (BSTO). However, alternate FE materials are well known and may perform equivalently. Returning the FIG. 12b for example, the dielectric with ferroelectric material 1212 can be formed in a thin film layer having a thickness 1214 in the range from 0.15 to 2 microns. Alternately, the dielectric with ferroelectric material 1212 is formed in a thick film having a thickness 1214 in the range from 1.5 to 1000 microns. In some aspects, the dielectric with ferroelectric material has a dielectric constant in the range between 100 and 5000 at zero volts. In other aspects, the dielectric formed from the first material with a fixed dielectric constant and the dielectric formed from the ferroelectric material have a composite dielectric constant in the range between 2 and 100 at zero volts.

The dielectric constant of the FE material can be manipulated through doping and control of the Curie temperature (Tc). Some popular dopant materials are tungsten (W), manganese (Mn), and magnesium (Mg), introduced as oxides. However, other equivalent elements in the same column of the periodic table may also be practical. An FE material has its greatest dielectric constant at Tc, with the dielectric falling off rapidly with changes of temperature in either direction. However, there is typically less change in dielectric constant for temperature above Tc. Therefore, the Tc of an FE material is typically chosen to be below the operating temperature seen by the dielectric material.

An antenna built with a dielectric constant of 1 (air) has less loss than an antenna built with higher dielectric constant material. However, higher dielectric constant materials are often useful in reducing the size (the effective wavelength) of antennas. Generally, an antenna designer seeks a dielectric material with dielectric constant of less than 100. The FE material dielectric constants can be reduced by adding dopants at the cost of variability (less change in dielectric constant per bias volt). Suitable tradeoffs between Tc and doping can make practical a greater than 2:1 change in FE material dielectric for less than a volt change in bias voltage.

Figure 14:
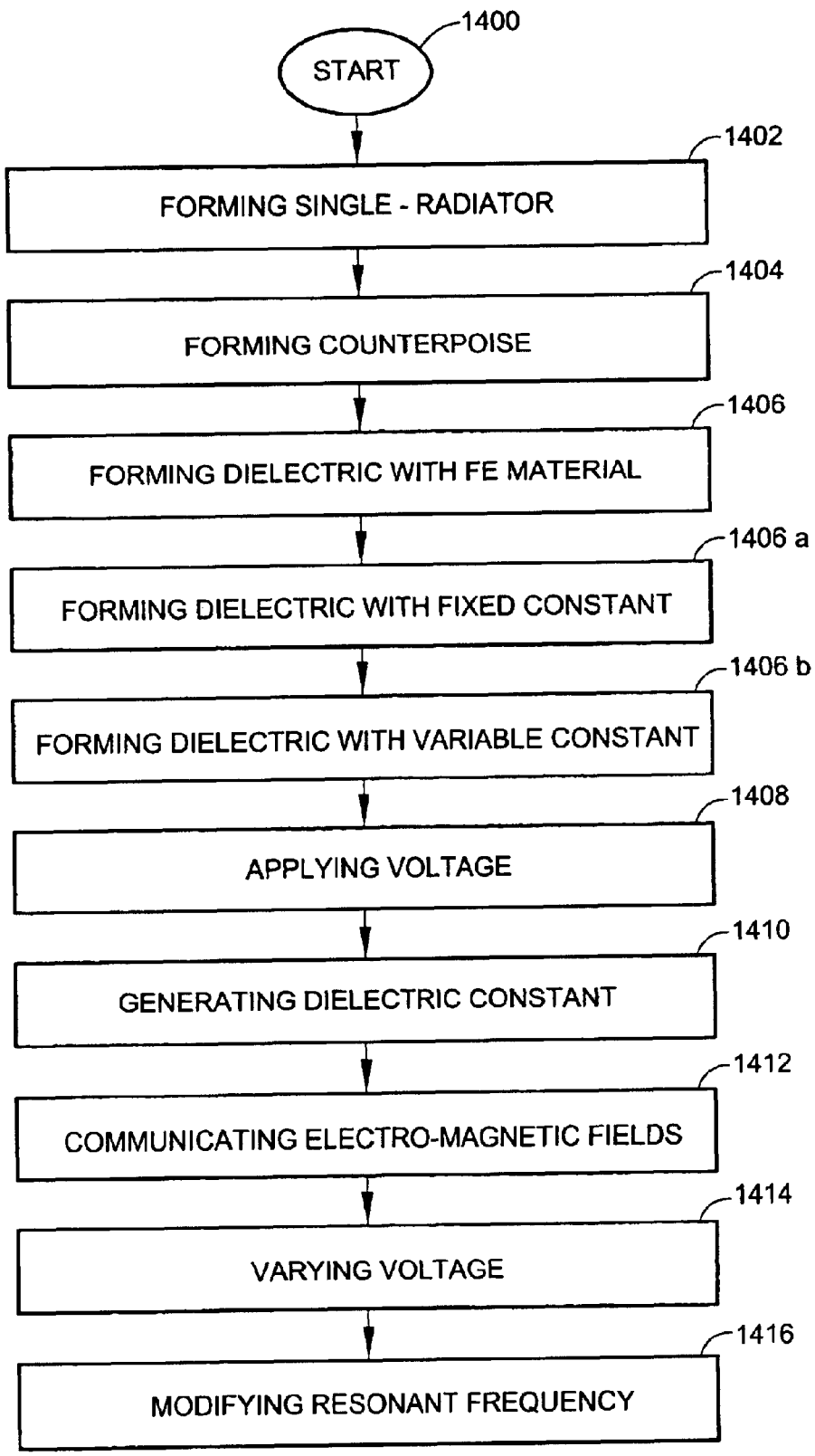
FIG. 14 is a flowchart illustrating the present invention method for frequency tuning a single-band wireless communications antenna.

FIG. 14 is a flowchart illustrating the present invention method for frequency tuning a single-band wireless communications antenna. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 1400. Step 1402 forms a single-radiator. In some aspects, Step 1404 forms a counterpoise to the radiator. Step 1406 forms a dielectric with ferroelectric material proximate to the radiator. Step 1408 applies a voltage to the ferroelectric material. Step 1410, in response to applying the voltage, generates a dielectric constant. Step 1412, in response to the dielectric constant, communicates electromagnetic fields at a resonant frequency.

In some aspects of the method a further step, Step 1414 varies the applied voltage. Then, Step 1416 modifies the resonant frequency in response to changes in the applied voltage. In some aspects, modifying the resonant frequency includes forming an antenna with a variable operating frequency responsive to the applied voltage.

Forming an antenna with a variable operating frequency includes forming an antenna with a predetermined fixed characteristic impedance, independent of the resonant frequency. In other aspects, forming an antenna with a variable operating frequency includes forming an antenna with a predetermined approximately constant gain, independent of the resonant frequency.

In some aspects, forming a dielectric with ferroelectric material in Step 1406 includes substeps. Step 1406a forms the dielectric with a dielectric material from a first material having a fixed dielectric constant. Step 1406b forms the dielectric with the ferroelectric material having a variable dielectric constant. Then, modifying the resonant frequency in response to the varying dielectric constant in Step 1416 includes modifying the resonant frequency in response to the varying the dielectric constant of the ferroelectric material.

In other aspects, forming a dielectric with ferroelectric material in Step 1406 includes forming the dielectric with a plurality of dielectric materials, each from a material having a fixed dielectric constant. Alternately, Step 1406 can include forming the dielectric with a plurality of ferroelectric materials, each having a variable dielectric constant.

In one aspect, Step 1406 includes forming the dielectric with the fixed dielectric constant adjacent the dielectric with the ferroelectric materials. In one aspect of the method, Step 1406a includes forming the dielectric with the fixed dielectric constant adjacent the radiator. Alternately, Step 1406b includes forming the dielectric with the ferroelectric material adjacent the radiator.

In another aspect, forming a dielectric with a fixed dielectric constant in Step 1406a includes forming the dielectric from a material selected from the group including foam, air, FR4, Aluminina, and TMM. Step 1406b includes forming the dielectric with the ferroelectric material from barium strontium titanate, $Ba_xSr_{1-x}TiO_3$ (BSTO).

In some aspects, Step 1406 includes forming the dielectric with ferroelectric material includes forming the ferroelectric material in a thin film having a thickness in the range from 0.15 to 2 microns Alternately, a thick film having a thickness in the range from 1.5 to 1000 microns can be formed. In some aspects Step 1406 includes forming a dielectric with a dielectric constant in the range between 100 and 5000 at zero volts. In other aspects, forming the dielectric with ferroelectric material includes forming a FE dielectric layer (Step 1406b) and a fixed constant dielectric layer (Step 1406a) with a composite dielectric constant in the range between 2 and 100 at zero volts.

In some aspects, communicating electromagnetic fields at a resonant frequency in Step 1412 includes communicating at resonant frequencies such as 824 and 894 MHz and 1850 and 1990 MHz.

In some aspects, applying a voltage to the ferroelectric material in Step 1410 includes applying a relative dc voltage in the range between 0 and 3.3 volts.

Figure 15:
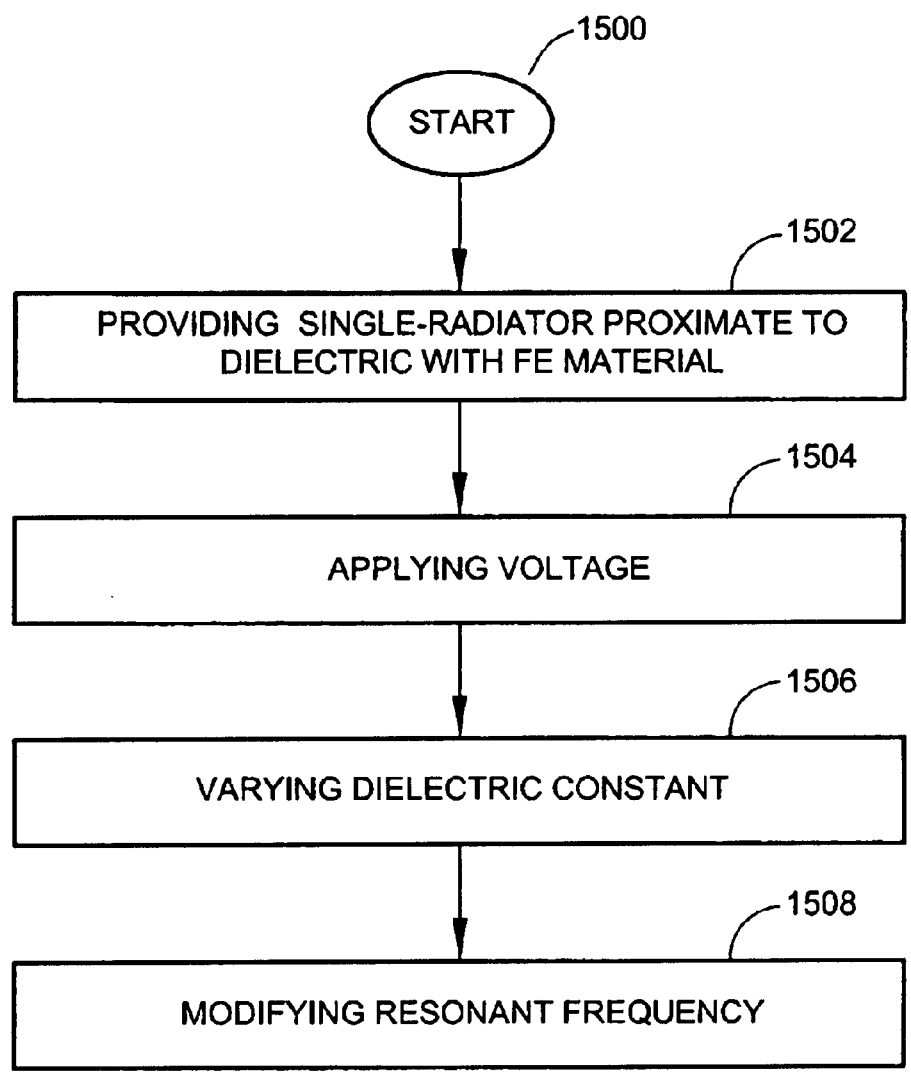
FIG. 15 is a flowchart illustrating an alternate aspect of the method depicted in FIG. 14.

FIG. 15 is a flowchart illustrating an alternate aspect of the method depicted in FIG. 14. The method starts at Step

1500. Step 1502 providing a single-radiator proximate to a dielectric with ferroelectric material. Step 1504 applies a voltage to the ferroelectric material. Step 1506, in response to the applying voltage, varies the dielectric constant of the ferroelectric material. Step 1508, in response to varying the dielectric constant of the ferroelectric material, modifies the resonant frequency of the radiator.

A family of antennas fabricated with FE dielectric material has been provided. A few antenna styles have been given to explain the fundamental concepts. However, the present invention is not limited to just these antenna designs. In fact, the present invention FE dielectric material is applicable to any antenna using a dielectric. Likewise, a few examples of FE dielectric placement have been given, but once again the present invention is not limited to merely these examples. Other variations and embodiments of the invention will occur to those skilled in the art.

We claim:

1. A dipole antenna with a selectable operating frequency, the dipole antenna comprising:

a radiator having a helical shape;

a counterpoise having a helical shape;

a dielectric at least partially surrounding the radiator, the dialectric including a ferroelectric material having a varying dielectric constant responsive to a voltage applied to the ferroelectric material; and wherein the radiator and the counterpoise each have an electrical length responsive to the varying dielectric constant.

* * * * *